United States Patent
Schopohl et al.

(10) Patent No.: US 6,690,162 B1
(45) Date of Patent: Feb. 10, 2004

(54) DEVICE FOR HIGH-RESOLUTION MEASUREMENT OF MAGNETIC FIELDS

(75) Inventors: Nils Schopohl, Reutlingen (DE); Christoph Haeussler, Stuttgart (DE); Joerg Oppenlaender, Kirchentellinsfurt (DE)

(73) Assignee: Qest Quantenelektronische Systeme, Böblingen (DE)

( * ) Notice: Subject to any disclaimer, the term of this patent is extended or adjusted under 35 U.S.C. 154(b) by 0 days.

(21) Appl. No.: 09/857,269

(22) PCT Filed: Sep. 5, 2000

(86) PCT No.: PCT/DE00/03034
§ 371 (c)(1),
(2), (4) Date: Nov. 16, 2001

(87) PCT Pub. No.: WO01/25805
PCT Pub. Date: Apr. 12, 2001

(30) Foreign Application Priority Data

Oct. 4, 1999 (DE) ........................ 199 47 615

(51) Int. Cl.[7] ............................ G01R 33/035
(52) U.S. Cl. ........................ 324/248; 505/846
(58) Field of Search ............... 324/248; 505/846; 327/528; 600/409; 259/31–34

(56) References Cited

U.S. PATENT DOCUMENTS 4,393,349 A * 7/1983 Burbank et al. ............ 324/248

(List continued on next page.)

FOREIGN PATENT DOCUMENTS

| DE | 36 39 623 | 10/1988 | ............ H03M/1/12 |
| DE | 41 39 212 | 2/1994 | ......... G01R/33/035 |
| DE | 43 23 040 | 1/1995 | ............ H01L/39/22 |
| DE | 196 29 583 | 1/1998 | ............ H01L/39/14 |
| JP | 57-132072 | 8/1982 | ......... G01R/33/035 |
| JP | 404002979 A | * 1/1992 | ......... G01R/33/035 |

OTHER PUBLICATIONS

Oppenlander et al. "Superconducting Multiple Loop Quantum Interferometers," IEEE Transactions on Applied Superconductivity, vol. 11, No. 1, Mar. 2001, pp. 1271–1274.*
Patent Abstracts of Japan, vol. 006, No. 29, Nov. 16, 1982.
Hansen, Bindslev et al. "Static and Dynamic Interactions Between Josephson Junctions", Reviews in Modern Physics, vol. 56, No. 3, Jul. 1984, pp. 431–459.

*Primary Examiner*—N. Le
*Assistant Examiner*—Darrell Kinder
(74) *Attorney, Agent, or Firm*—Hogan & Hartson LLP

(57) ABSTRACT

A device is proposed for high-resolution measurement, in particular for high-resolution absolute measurement of magnetic fields, having a network (1) of transitions (3) between superconductors (5, 6) which exhibit Josephson effects, called junctions below, the network comprising closed meshes (7, 8, 9, 10, 11, 12, 13), denoted by cells below, which in each case have junctions (3), which junctions are connected in a superconducting fashion, and at least three of these cells being connected in a superconducting and/or nonsuperconducting fashion. The object of the invention consists in further developing this device in such a way that it is possible to make absolute measurements of magnetic fields in a highly sensitive fashion. This object is achieved by virtue of the fact that the junctions (3) of the at least three cells (7, 8, 9) can be energized in such a way that a time-variant voltage drops in each case across at least two junctions of a cell, the time average of which voltage does not vanish, and in that the at least three cells are configured differently geometrically in such a way that the magnetic fluxes enclosed by the cells in the case of an existing magnetic field differ from one another in such a way that the frequency spectrum of the voltage response function has no significant $\Phi_0$-periodic component with reference to the magnetic flux.

21 Claims, 18 Drawing Sheets

U.S. PATENT DOCUMENTS

Figure 1A:
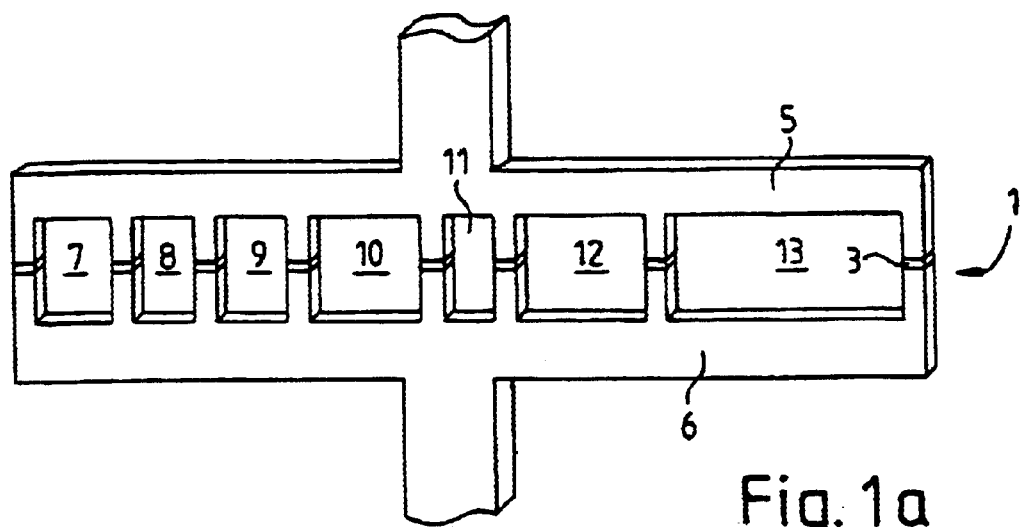

| | | | | |
|---|---|---|---|---|
| 4,473,833 A | * | 9/1984 | Beha et al. | 257/36 |
| 4,509,018 A | * | 4/1985 | Gershenson | 330/61 R |
| 5,093,618 A | | 3/1992 | Goto et al. | 324/248 |
| 5,326,986 A | | 7/1994 | Miller, Jr. et al. | 505/162 |
| 5,334,884 A | * | 8/1994 | Tesche | 327/113 |
| 5,343,147 A | * | 8/1994 | Sager et al. | 324/239 |
| 5,453,691 A | * | 9/1995 | David et al. | 324/248 |
| 5,532,485 A | | 7/1996 | Bluzer et al. | 250/336.2 |
| 5,574,290 A | | 11/1996 | You | 257/31 |
| 5,831,278 A | * | 11/1998 | Berkowitz | 257/31 |
| 6,066,948 A | * | 5/2000 | Seppa | 324/248 |

OTHER PUBLICATIONS

S. Krey, et al. Highly Sensitive Magnetometers based on $Yba_2Cu_3O_7$ Josephson junction arrays, Applied Physics Letters, vol. 74, No. 2, Jan. 11, 1999, pp. 293–295.

Patent Abstracts of Japan JP 11026821 Jan. 29, 1999.

* cited by examiner

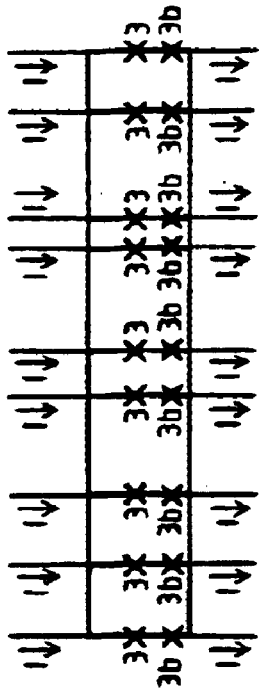
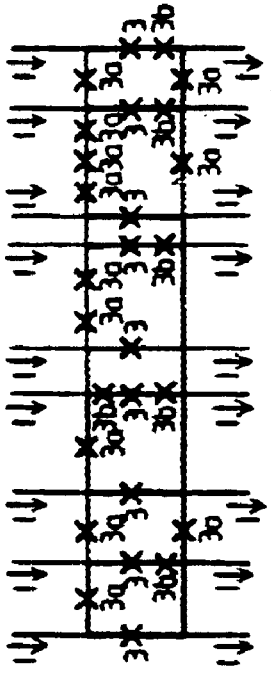
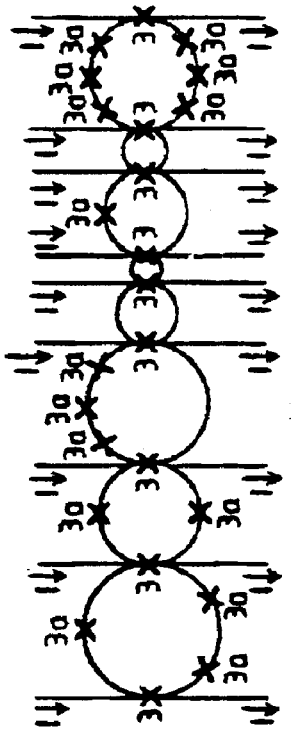
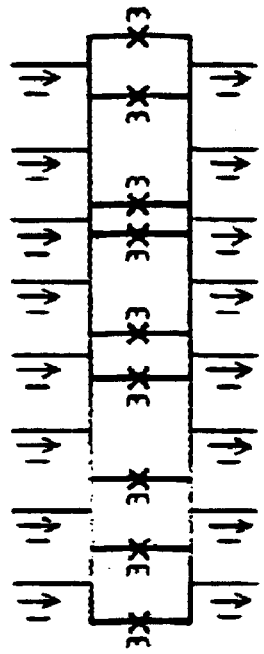
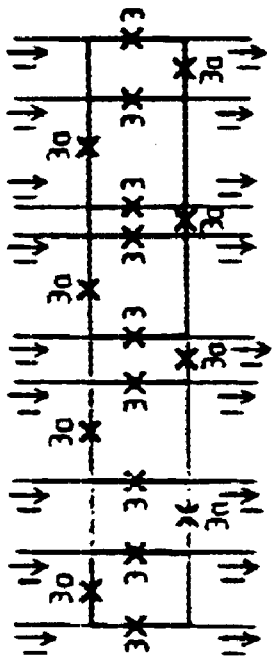
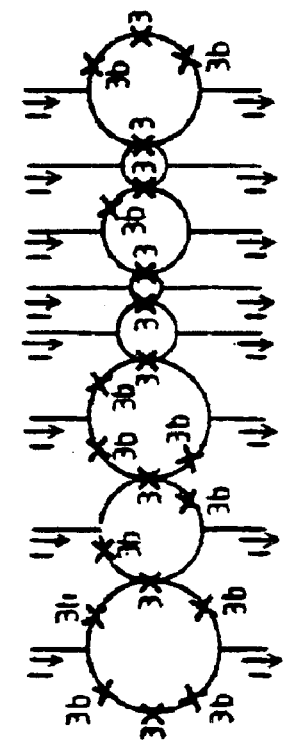

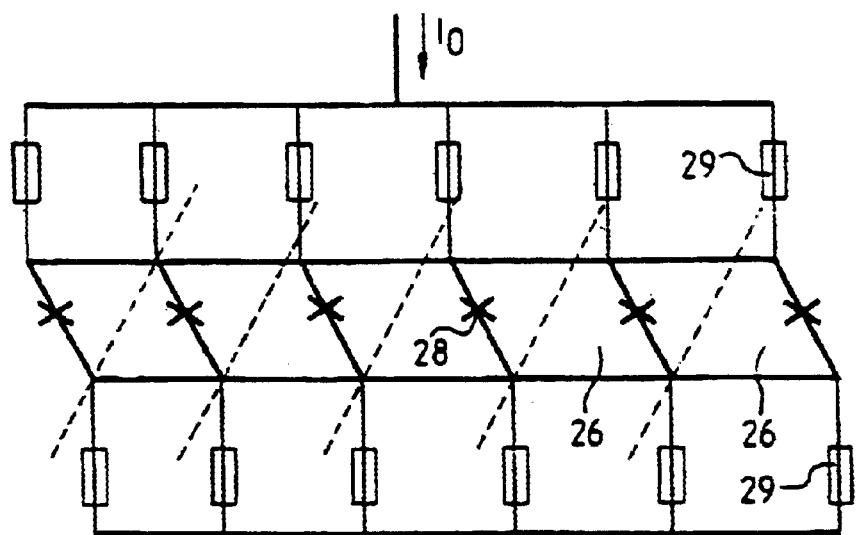
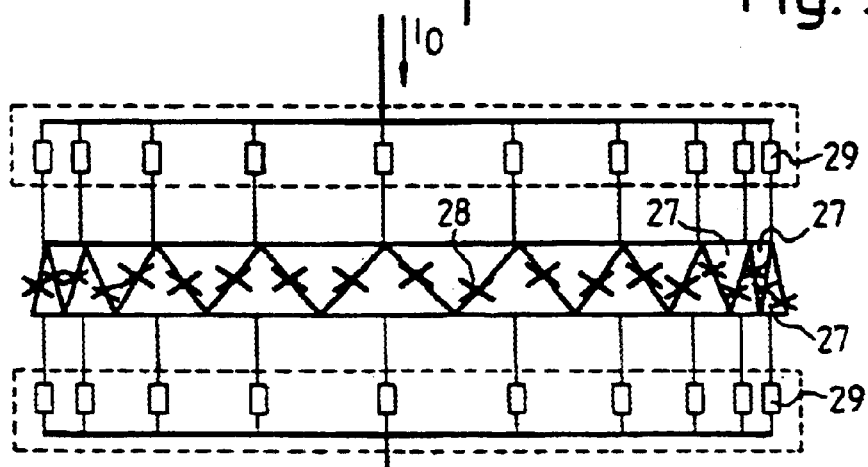
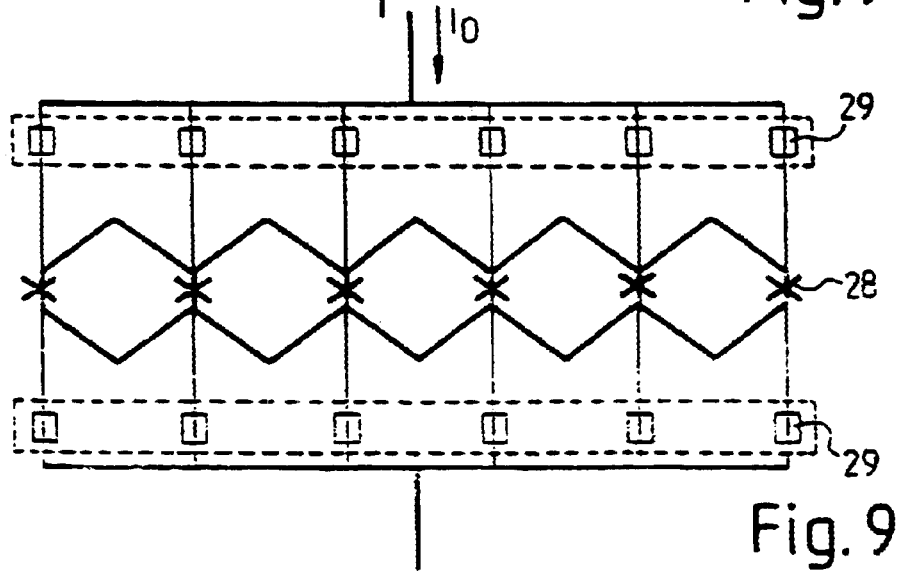
Fig. 9a
Fig. 9b
Fig. 9c

DEVICE FOR HIGH-RESOLUTION MEASUREMENT OF MAGNETIC FIELDS

The invention relates to a device for high-resolution measurement, in particular for high-resolution absolute measurement of magnetic fields.

PRIOR ART

The measuring principle is based on the physical effect of macroscopic quantum interference as it occurs in closed circuits made from superconducting materials which are coupled to one another by Josephson tunnel junctions or, in general, what are termed weak links.

It is known to be possible simply to use closed superconducting circuits which contain Josephson junctions or weak links to measure very small magnetic field changes down to the range of fT ($10^{-15}$ tesla). In the case of devices corresponding to the prior art, what are termed "SQUIDs" (Superconducting Quantum Interference Devices), use is simply made of closed superconducting current loops which usually contain two Josephson junctions, but also more in individual applications. If these current loops are driven by a current which is below a critical current, no voltage drops across the junctions. In modern SQUIDs, the current loops are, however, driven by a temporally constant supercritical current, such that a temporally quickly changing AC voltage drops across the two superconducting electrodes on both sides of the junctions. The frequency of this AC voltage depends on the strength of the driving current $I_0$ and the strength of the magnetic flux $\Phi = B_\perp F$ which penetrates the loop, $B_\perp$ denoting the component, perpendicular to the surface F of the SQUID, of the vector magnetic field $\vec{B}$. Serving as easily accessible measured quantity is the DC voltage according to $<V(\vec{B};I_0)>$, dropping across the current loop, which is produced by time averaging of the quickly changing AC voltage over one or more periods. The calibration curve $<V(\vec{B};I_0)>$ of such a typical two-DC junctions SQUID is sketched in FIG. 12. Whenever the flux $\Phi$ penetrating the loop corresponds to an integral multiple of the elementary flux quantum $$\Phi_0 = \frac{h}{2e} \cong 2 \times 10^{-15} Tm^2,$$

the calibration curve assumes a minimum, whereas it assumes a maximum for half-integer multiples of the elementary flux quantum $\Phi_0$. The calibration curves of all previously known SQUID systems have such a periodicity. For a known area F of the current loop, the component, perpendicular to this area, of the magnetic induction $\vec{B}$ can be determined up to an integral multiple of $\Phi_0$, that is to say it is therefore possible in principle to measure only $\Phi \bmod \Phi_0$. Because of the periodicity of the calibration curve $<V(\vec{B};I_0)>$, it is therefore impossible to use conventional SQUIDs for absolute quantitative precision measurement of the magnetic induction $\vec{B}$. At present, this requires the very complicated and expensive combination of this with other physical measurement methods such as, for example, connection to optically pumped magnetometers. The commercial fields of application of SQUIDs are therefore limited to the detection of spatial or temporal, relative field changes such as occur, for example, in the case of material testing or when investigating metabolic processes in biological organisms. However, it is necessary in the case of these applications as well for the order of magnitude of the field changes to be known from the start if the measurement is to permit more than purely qualitative statements or rough estimates.

It is the object of the invention to create a simple device which permits highly precise absolute measurement of, in particular, even time-variant magnetic fields, and in the process can have recourse in full measure to the cryotechnology developed for conventional SQUIDS.

The invention proceeds from a device for high-resolution measurement, in particular for high-resolution absolute measurement of magnetic, in particular time-variant, magnetic fields, which comprises a network of transitions between superconductors which exhibit Josephson effects, called junctions below, the network having closed meshes, denoted by cells below, which in each case have at least two junctions, which junctions are connected in a superconducting fashion, and at least three of these cells being electrically connected in a superconducting and/or nonsuperconducting fashion. The core of the invention resides in the fact that the junctions of the at least three cells can be energized in such a way that a time-variant voltage drops in each case across at least two junctions of a cell, the time average of which voltage does not vanish, and in that the at least three cells are configured differently geometrically in such a way that the magnetic fluxes enclosed by the cells in the case of an existing magnetic field differ from one another in such a way that the frequency spectrum of the voltage response function has no significant $\Phi_0$-periodic component with reference to the magnetic flux, or in that, if a discrete frequency spectrum exists, the contribution of the $\Phi_0$-periodic component of the discrete frequency spectrum is not dominant by comparison with the non-$\Phi_0$-periodic component of the discrete frequency spectrum.

With regard to the periodicity of the voltage response function, it is also possible to select the following functional approach: that the at least three cells are configured differently geometrically in such a way that the magnetic fluxes enclosed by the cells in the case of an existing magnetic field form a ratio to one another in such a way that the period of the voltage response function of the network with reference to the magnetic flux penetrating the network cells in their entirety is greater or very much greater than the value of an elementary flux quantum and/or the voltage response no longer has a $\Phi_0$-periodic component. The invention is based on the finding that in the ideal case the voltage response function no longer has a period when the magnetic fluxes enclosed by the cells are not in a rational ratio to one another. In addition, the differences in area between the individual cells are preferably relatively large. In particular, cells connected in a superconducting fashion are superimposed in such a way that the voltage response function no longer has a period.

Consequently, according to the invention different cells are connected to one another specifically, and this is something the person skilled in the art would always want to avoid with conventional SQUID arrangements. This is expressed, for example, in the publication by HANSEN, BINSLEV J., LINDELOF P. E.: Static and dynamic interactions between Josephson junctions. In: Reviews of Modern Physics, Vol. 56, No. 3, July 1984, p. 431 to 459. On page 434, left-hand column, last paragraph and subsequently in the right-hand column, this publication favors a system with identical cells and identical junctions and, by contrast, classifies asymmetries as counterproductive for the functioning of the SQUID described in this regard.

Devices according to the invention (denoted below as superconducting quantum interference filters or SQIFs), by contrast, exhibit the physical effect of multiple macroscopic quantum interference in such a way that the ambiguity of the calibration curves of conventional SQUID magnetometers and SQUID gradiometers is removed.

In a superconducting quantum interference filter, the quantum mechanical wave functions which describe the state of the superconducting solid interfere in such a way that a unique microscopic calibration curve $<V(\vec{B};I_0)>$ is produced. In the ideal case, the calibration curve $<V(\vec{B};I_0)>$ of the superconducting quantum interference filter has no periodicity with the period $\Phi_0$ and is a function, rising monotonically in a specific measuring range, of the absolute value of the external magnetic field $\vec{B}$ at the location of the SQIF.

The uniqueness of the calibration curve, and the high sensitivity of superconducting quantum interference filters permit the direct measurement of time-variant electromagnetic fields in a continuous frequency range whose lower bound is at $v_{ext} \approx 0$ and whose upper bound is currently at several hundred GHz to THz, depending on the type of Josephson junctions or weak links used. This entire frequency range is accessible with the aid of a single, appropriately designed superconducting quantum interference filter. In the detection of electromagnetic waves, the superconducting quantum interference filter operates simultaneously as a receiving antenna, filter and powerful amplifier. The inherent noise of suitably designed quantum interference filters can in this case be smaller by several orders of magnitude than the inherent noise of conventional SQUID magnetometers. A further advantage by comparison with conventional antennas and filters resides in this case in that, inter alia, depending on the measuring principle the frequency range is not a function of the spatial extent of the superconducting quantum interference filter. The spatial extent can influence only the sensitivity.

The production of superconducting quantum interference filters can be performed using known, cost-effective technical methods such as are applied, for example, in modern production of conventional SQUIDs. Since the spatial extent of superconducting quantum interference filters need not differ substantially from the spatial extent of conventional SQUID systems, the cryotechnologies developed for conventional SQUID systems can be taken over directly. There is no need for specific developments in the field of cryotechnology.

In a system made from the cells described above, it is preferable to provide for at least one cell, favorably for the largest part of the cells, exactly two junctions per cell which are connected in a superconducting fashion and connected electrically in parallel. The effects just described can be achieved comparatively simply and effectively by exactly two junctions.

However, the desired effects can also be achieved in a favorable way when more than two junctions are provided in a cell which are connected in a superconducting fashion and connected electrically in parallel, specifically in the form of a series circuit of junctions which is connected in parallel to an individual junction, or in the form of two parallel-connected series circuits of junctions.

However, the effects according to the invention can also be achieved by structures of at least one cell of a network, in the case of which, in addition to a basic form of at least two junctions across which a time-variant voltage whose time average does not vanish drops, in particular in addition to a basic form of two junctions connected electrically in parallel, a further junction or a plurality of further junctions are provided, which junctions are not directly energized (compare FIGS. 2b, 2e and 2f), and therefore there is no voltage drop on average across these junctions. In this case, the connections of all the junctions in the individual cells continues [sic] to be superconducting. Such embodiments can be advantageous, since the screening currents induced in the individual cells by a magnetic field can be reduced by additional junctions. The influence of self-inductances and mutual inductances can thereby be reduced.

The following references can be specified from the literature in relation to the prior art.

A. Barone and G. Paterno, Physics and Applications of the Josephson Effect, John Wiley, 1982.

J. Hinken, Superconducting Electronics, Springer, 1988.

K. K. Likharev, Dynamics of Josephson junctions and circuits. Gordon and Breach, New York, 1991.

T. P. Orlando and K. A. Delin, Foundations of Applied Superconductivity. Addison-Wesley, 1991.

R. D. Parmentier and N. F. Pedersen, Nonlinear superconducting devices and high-Tc materials. World Scientific, 1995.

C. P. Poole, H. A. Farach, and R. J. Creswick, Superconductivity. Academic Press, 1995.

J. B. Ketterson and S.N. Song, Superconductivity. Cambridge University Press, 1995.

S. T. Ruggiero and D. A. Rudman, Superconducting Devices. Academic Press, 1990.

J. C. Gallop et. al. [sic], SQUIDS, the Josephson Effect and Superconducting Electronics. Hilger, 1991.

T. VanDuzer and C. W. Turner, Principles of Superconductive Devices and Circuits. Elsevier, 1981.

J. Oppenländer, W. Güttinger, T. Traeuble, M. Keck, T. Doderer, and R. P. Heubener, IEEE Trans. Supercon. 9, 4337 (1999).

J. Oppenländer, Ch. Häussler, and N. Schopohl, J. Appl. Phys. 86, 5775 (1999).

H. Weinstock (editor), SQUID Sensors: Fundamentals, Fabrication and Applications. Kluwer Academic Publishers, 1996.

In a particularly preferred embodiment of the invention, a plurality of cells form a network or a network section, in which all junctions are connected electrically in parallel such that the junctions can be energized in the same direction. In particular, particularly high sensitivities for the measurement of a magnetic field can be achieved by means of such an arrangement when, in this connection, the cells are interconnected in a superconducting fashion.

A plurality of cells or network sections can, however, also be advantageously connected electrically in series such that the junctions in the network can in turn be energized in the same direction. The magnitude of the measurement signal can be increased by this measure, since the voltages at the junctions add together in the series circuit. A particularly high sensitivity can also be achieved by the parallel connection of series arrangements of the plurality of cells or network sections. Since, because of the larger number of cells in such embodiments, the inherent noise is, moreover, sharply reduced, this also permits the detection of magnetic fields whose strength is smaller by several orders of magnitude than in the case of conventional SQUID systems. In this embodiment, the network sections or cells are preferably connected in a superconducting fashion, in particular by means of superconducting twisted-pair cables. The resolution of superconducting quantum interference filters can in this case reach down to the range of aT ($10^{-18}$ tesla) and below. The calibration curve also remains unique for such measuring ranges, thus rendering possible absolute quantitative measurements of extremely small fields.

The network can be used in a voltage-driven or current-driven fashion.

In order to achieve Josephson effects which are as ideal as possible, it is proposed, furthermore, that the junctions are designed as point contacts.

In order to increase the sensitivity of a device according to the invention, it is further proposed that the geometry of the cell arrangement be designed so as to reduce magnetic crosstalk from one cell to an adjacent cell on the basis of the magnetic self-field produced by a current flowing in the cells.

In a further advantageous refinement of the invention, the network is fitted with a superconducting loop arrangement and/or planar arrangement, which displaces the magnetic field and/or strengthens it in such a way that the magnetic flux produced by a primary magnetic field in these superconducting regions is coupled into the cells of the network. In the case of SQUIDs, this is a known method for increasing their sensitivity since, owing to the "Meissner effect" of the superconductor, such loop arrangements have the property of forcing the magnetic flux penetrating them into their outer surroundings. If a SQIF or SQUID is arranged in these outer surroundings, a greatly increased magnetic field then prevails owing to this pickup loop. This holds not only for loop arrangements, but also for planar superconducting regions ("washers"). The term "flux focusing" is also used in this context. It has emerged that a SQIF can be coupled very much more effectively to a pickup loop than a conventional SQUID. The point is that, with conventional SQUIDs having a pickup loop, there is the problem that, because of the very different effective area of the SQUID (regularly at most approximately 50 $\mu$m×50 $\mu$m) and the effective area of the pickup look (regularly of the order of magnitude of cm×cm), a very severe mismatching of impedance occurs which constitutes a grave problem particularly with RF applications. Since the effective (total) area of SQIFs is generally very much greater than that of SQUIDs, the problem of a mismatching of impedance is very much less, or is solved, for SQIFs.

In a further preferred refinement of the invention, the cells of the network and/or network sections are spatially aligned, in particular in two-dimensional or three-dimensional space. These measures render it possible to determine individual magnetic field components in addition to the absolute value of the magnetic field. The direction of the magnetic field can therefore be measured in the case of a three-dimensional arrangement in space.

It is further preferred if the current driving the junctions is fed into, and/or led off again from, the network by ohmic resistors which are designed, in particular, as busbar resistors. The point is that measurements have shown that the performance of the SQIF can be substantially improved by feeding the driving current through ohmic resistors.

In a refinement of the invention which is also preferred, individual cells and/or network sections and/or the entire network are/is fitted with a compensation circuit for producing a secondary magnetic field in such a way that the magnetic flux produced by a primary magnetic field can be compensated in a controlled fashion by means of individual cells, network sections or the entire network. This can be realized, in particular, by virtue of the fact that a controllable static or time-variant magnetic field is produced at the location of individual cells and/or network sections and/or the entire network. The measuring range of the superconducting quantum interference filter can thereby be selected arbitrarily in principle.

The device according to the invention is preferably connected to an electronic computer in order, for example, to evaluate the voltage response of the network or to control the compensation circuit.

DRAWINGS

A plurality of exemplary embodiments of the invention are illustrated in the drawings and explained in more detail with a specification of further advantages and details.

Figure 2:
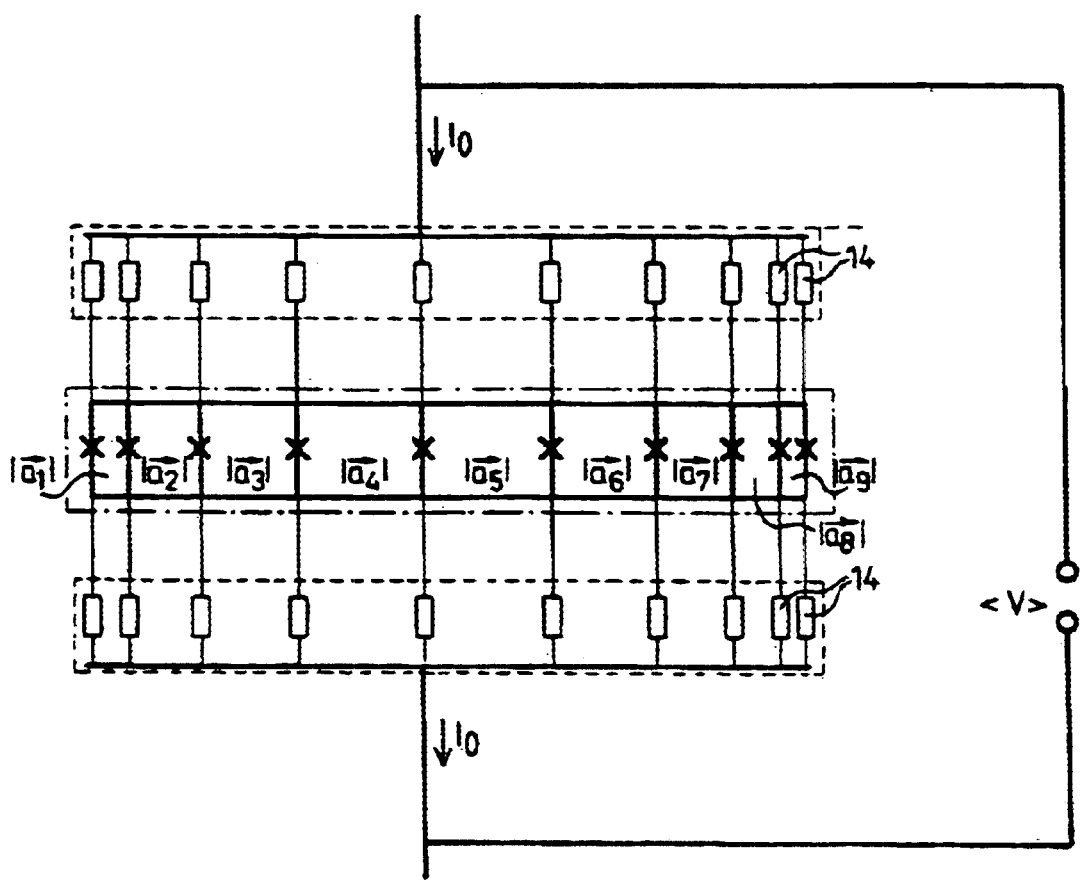
Figure 3:
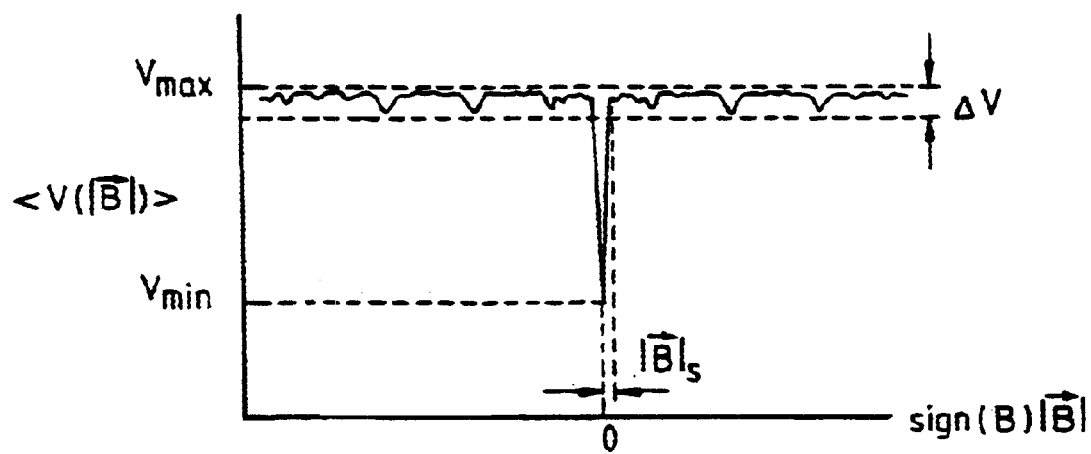
Figure 4A:
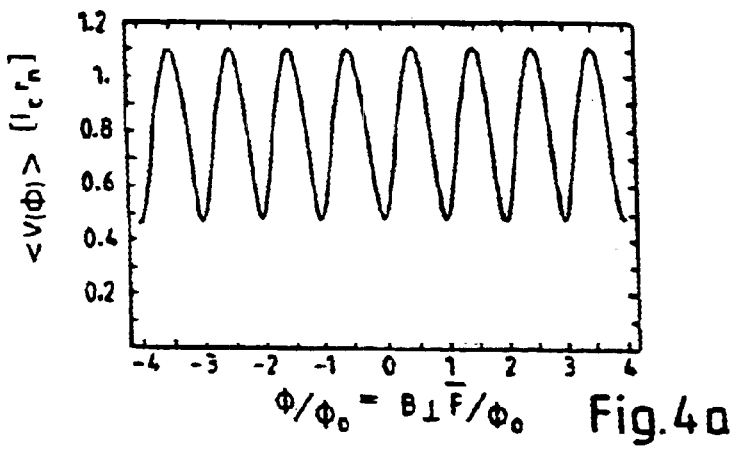
Figure 4B:
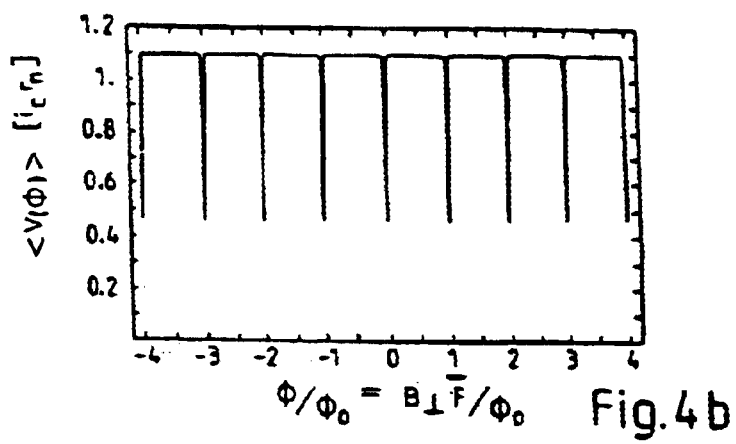
Figure 4C:
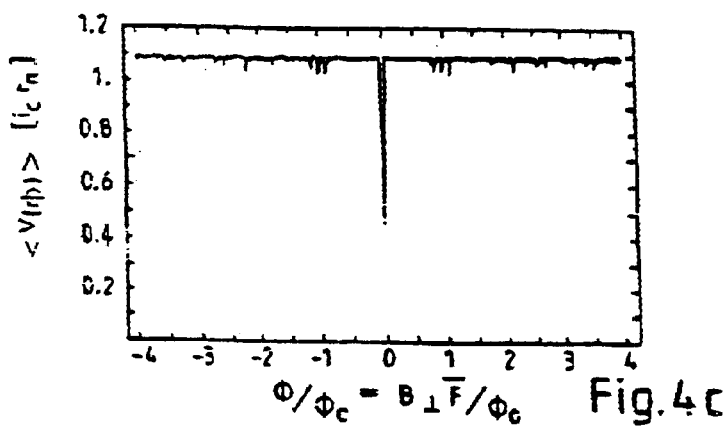
Figure 4D:
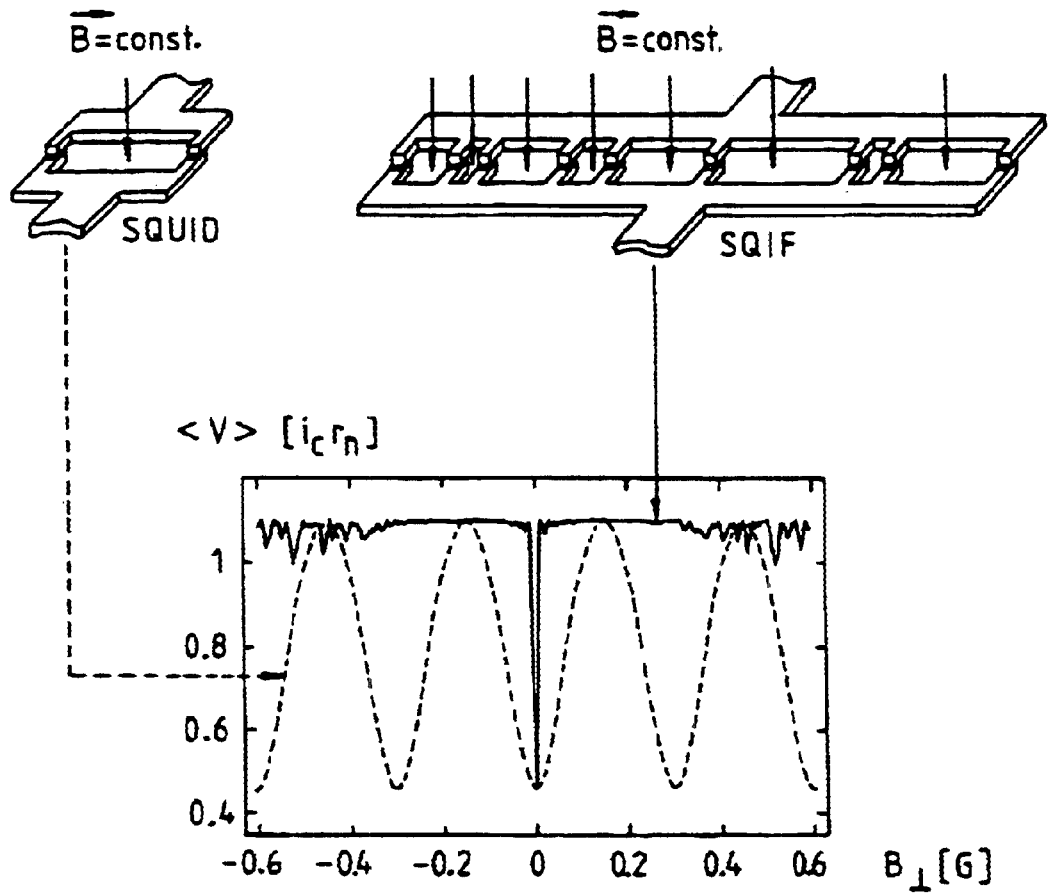
Figure 5:
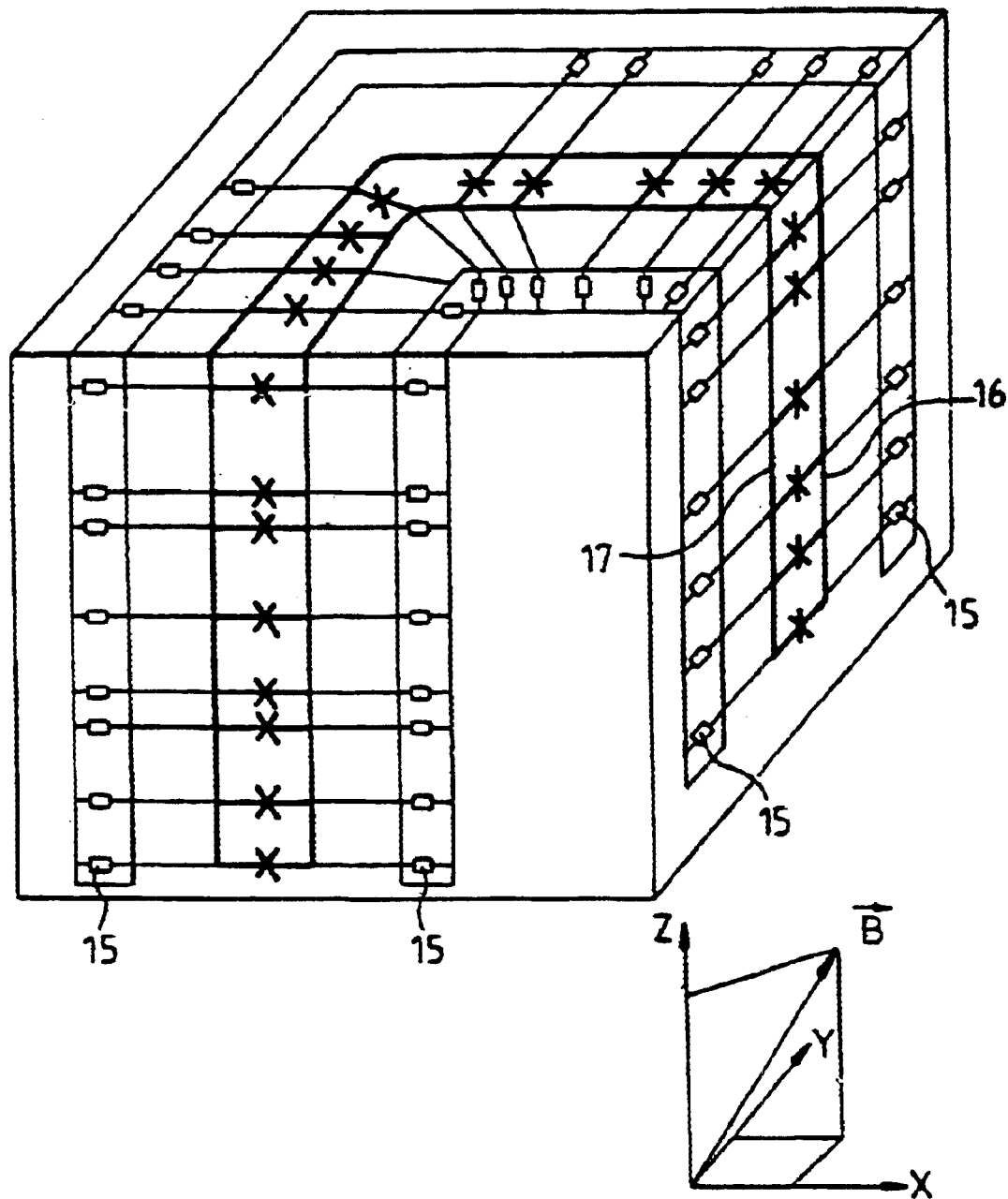
Figure 6:
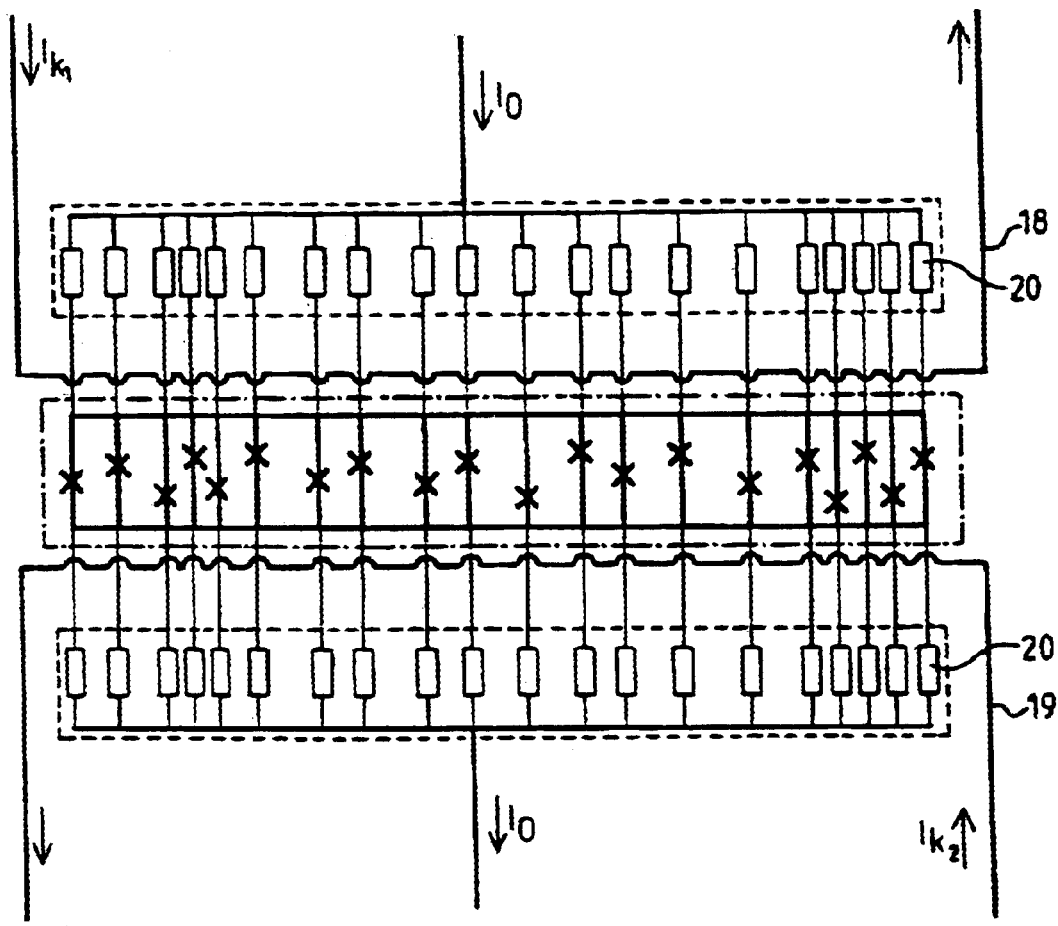
Figure 7:
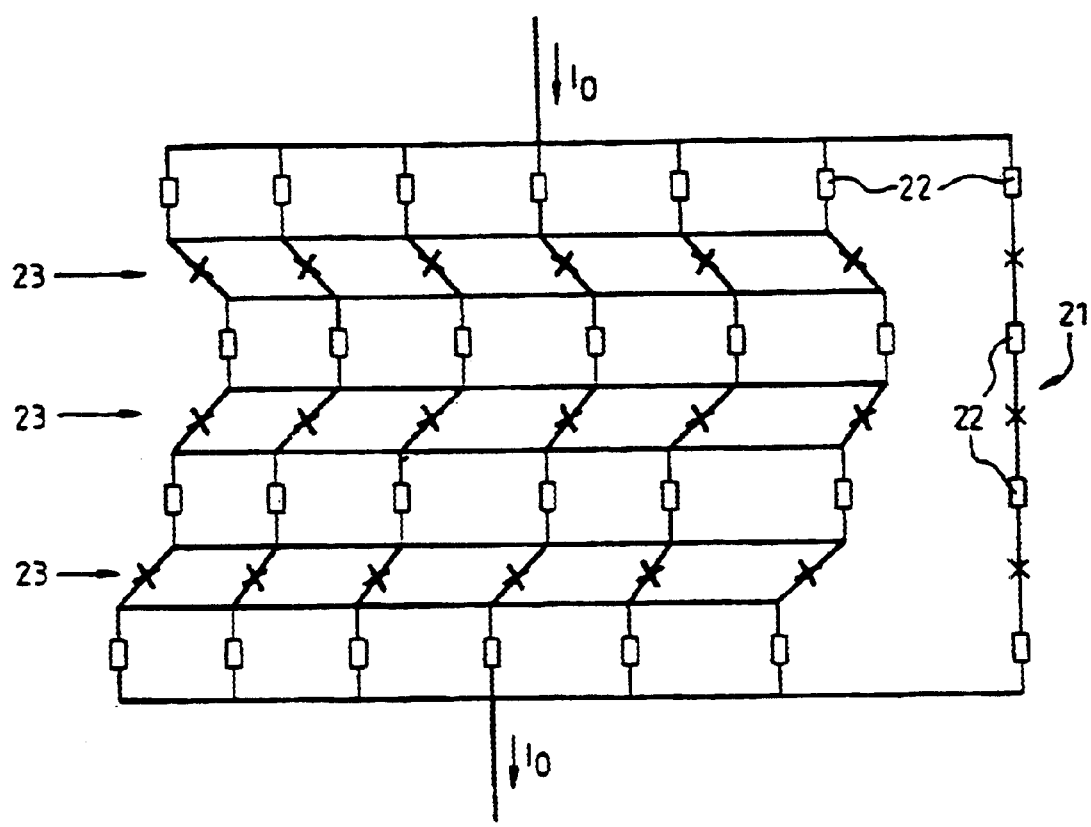
Figure 8:
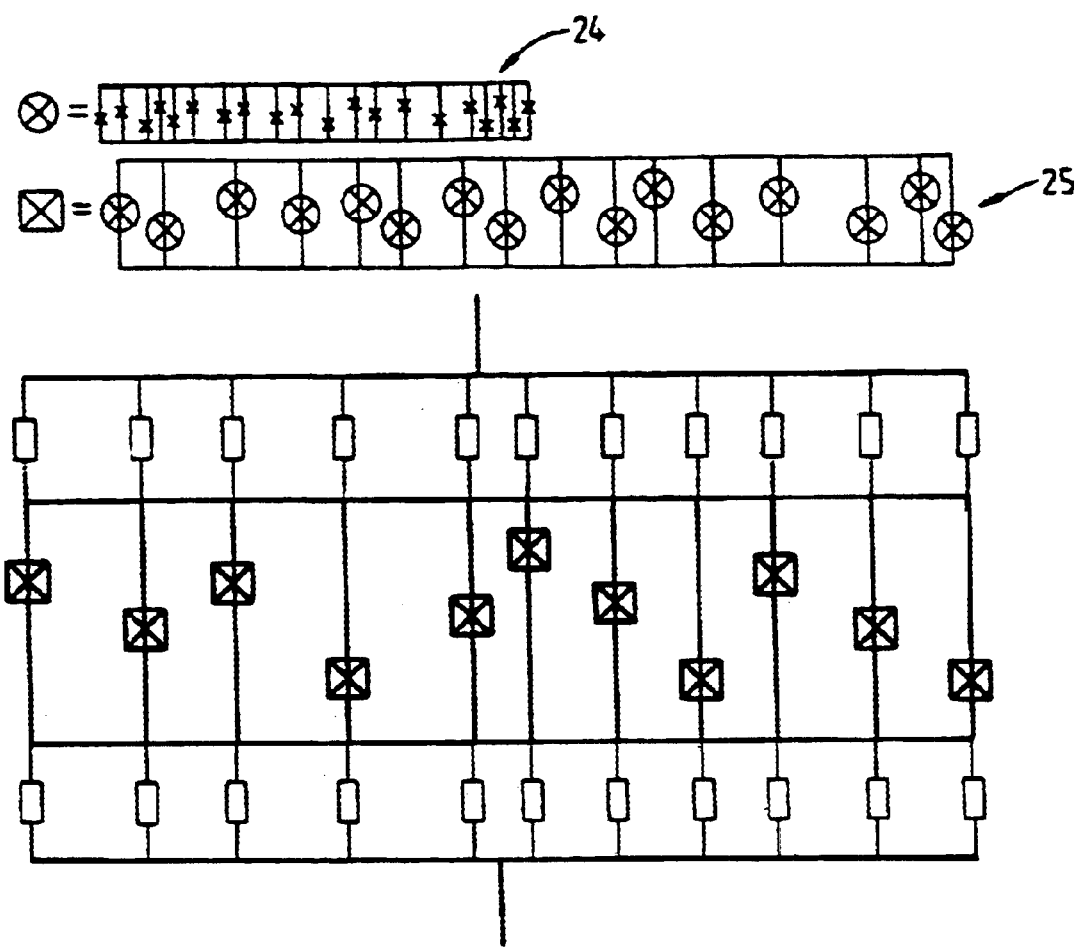
Figure 10A:
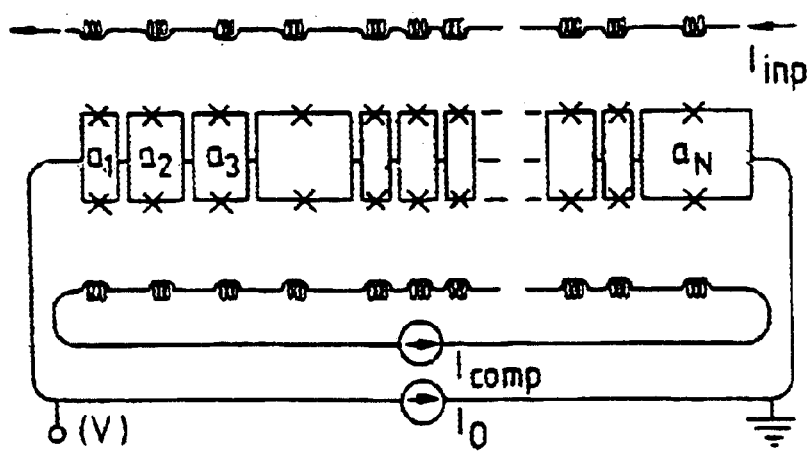
Figure 10B:
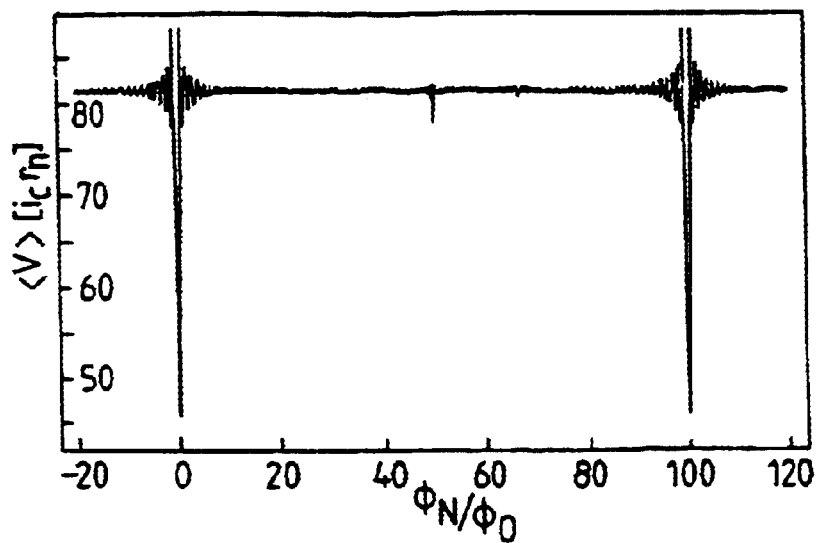
Figure 10C:
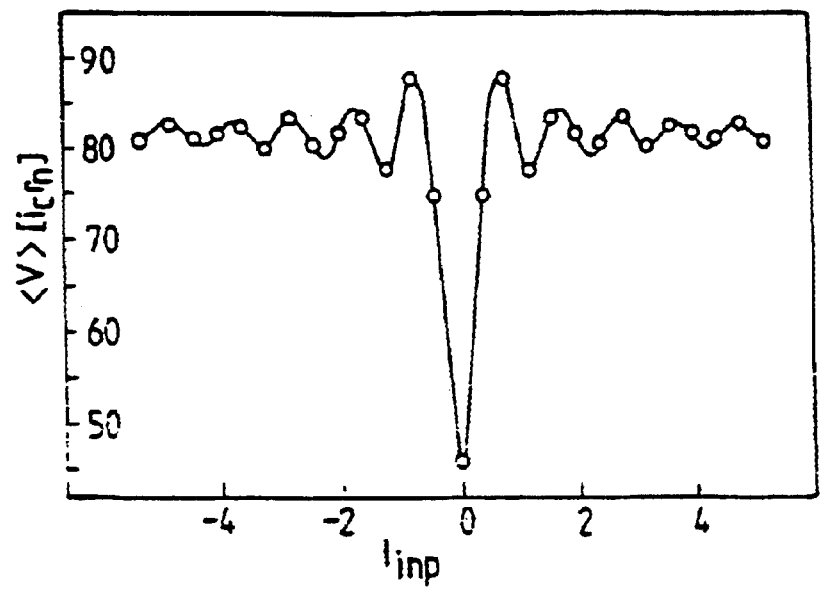
Figure 11A:
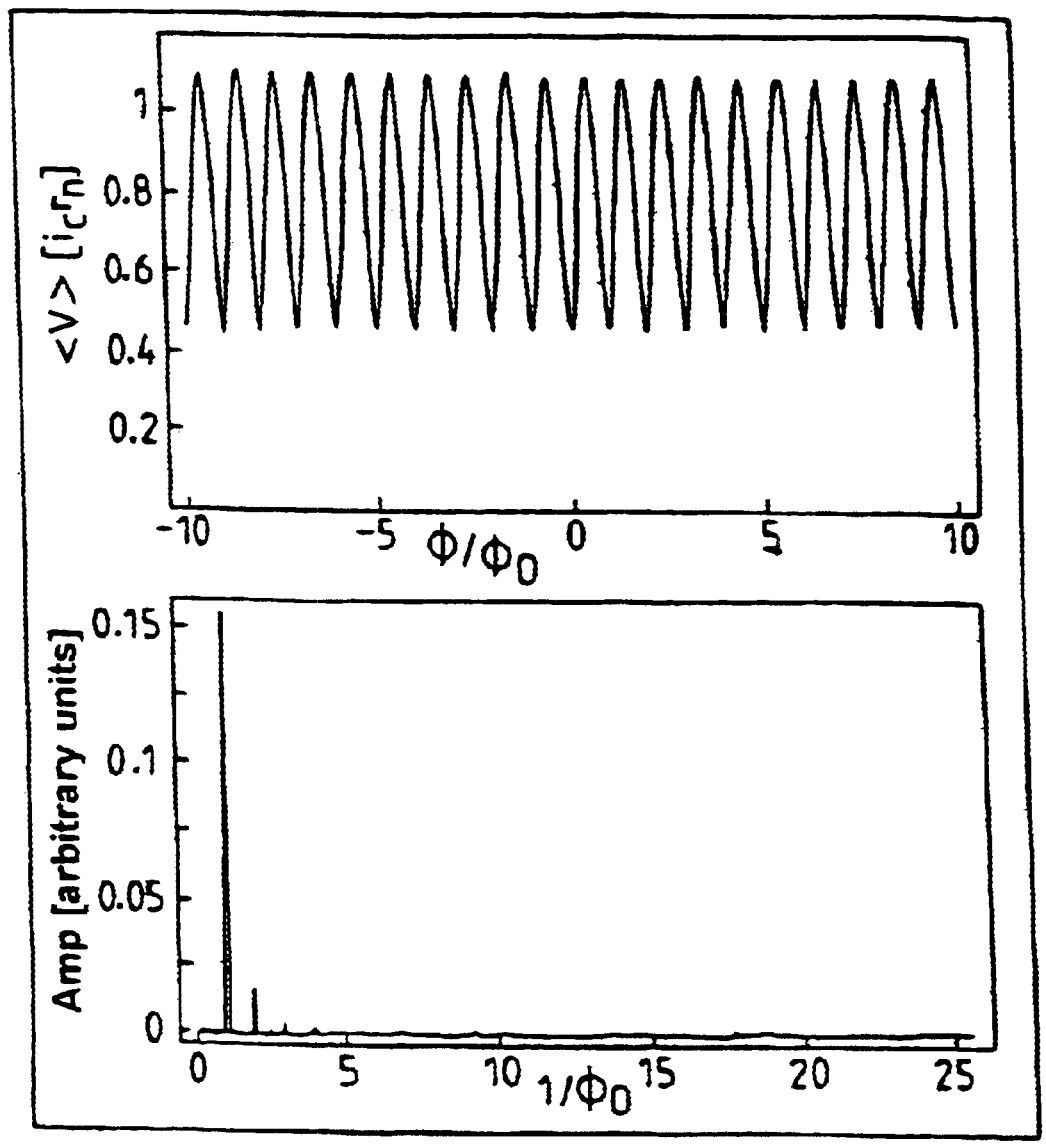
Figure 11B:
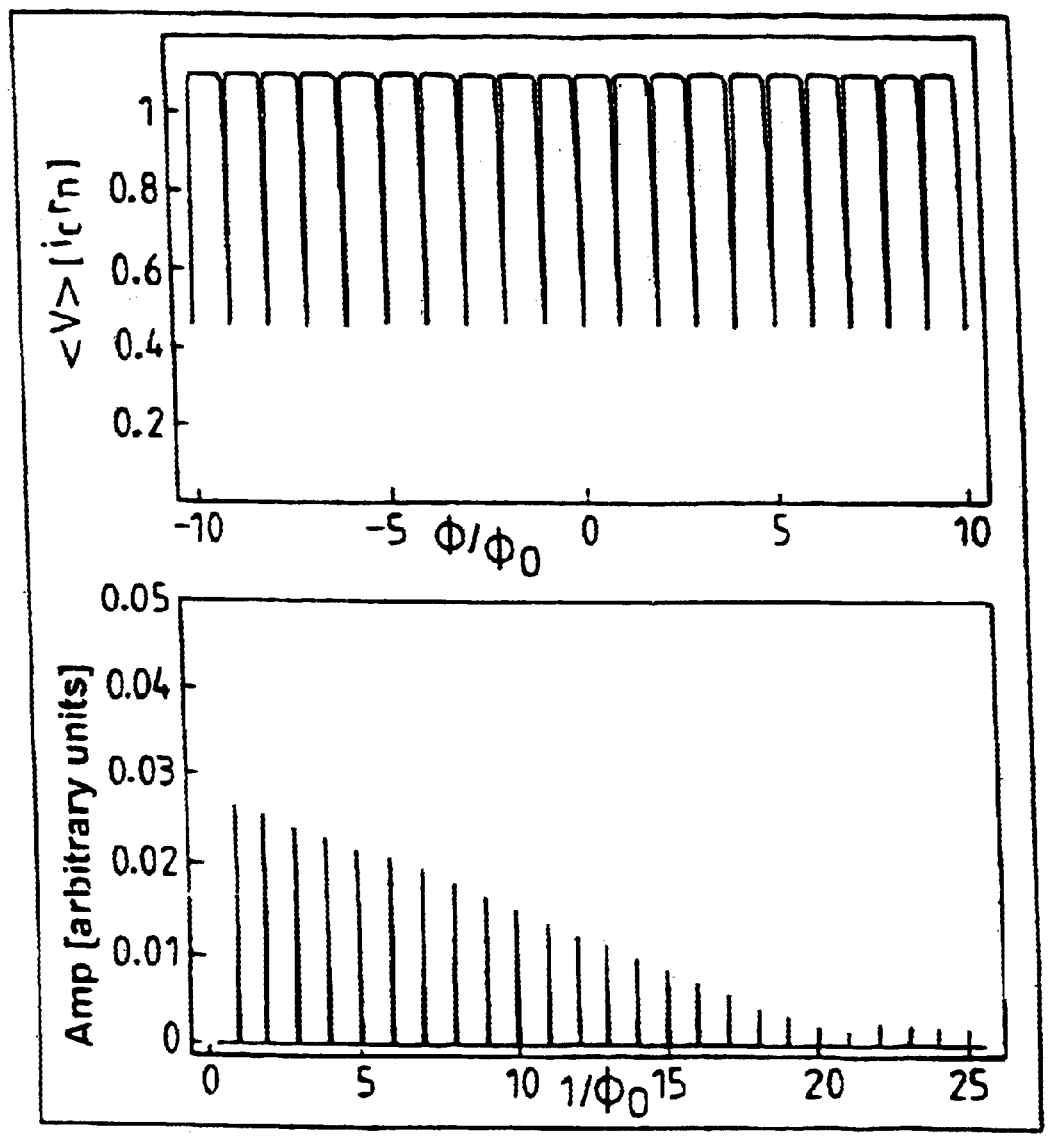
Figure 11:
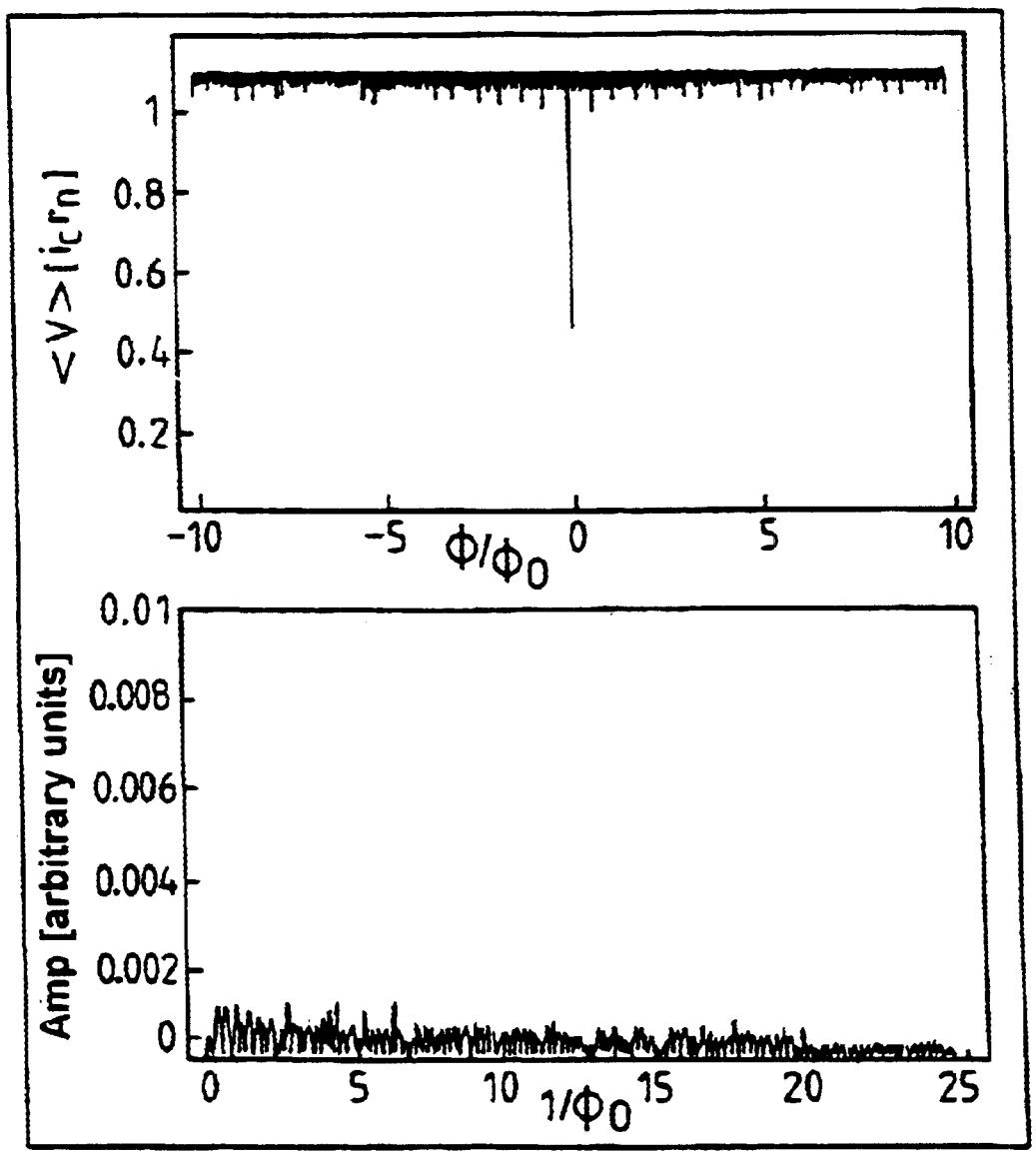
Figure 11D:
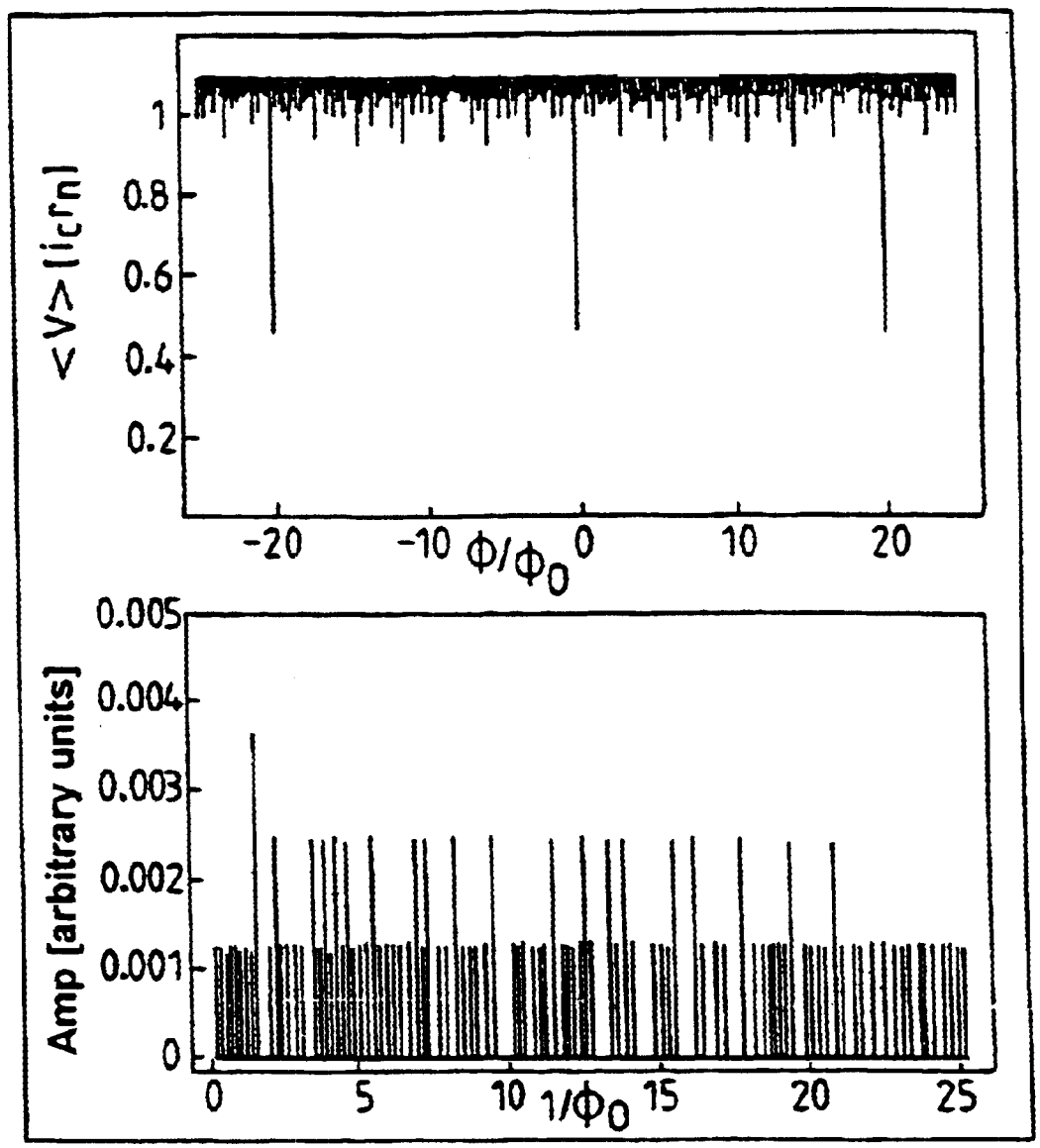
Figure 12:
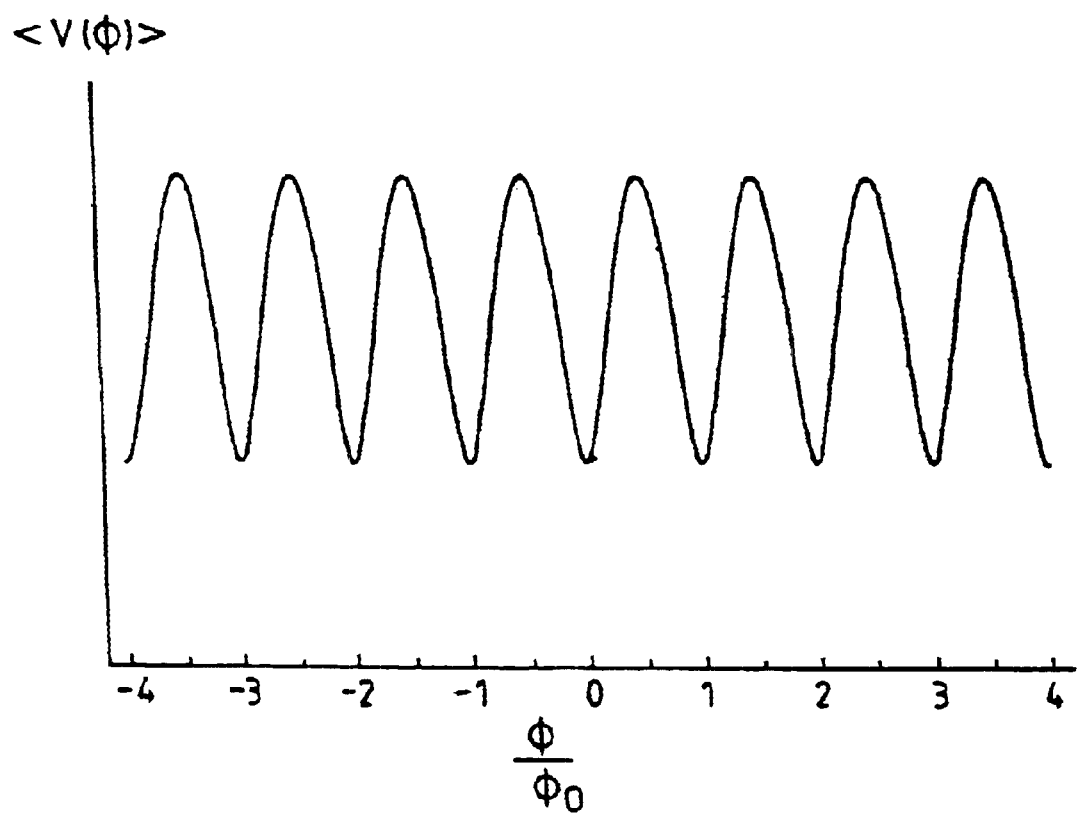
Figure 13:
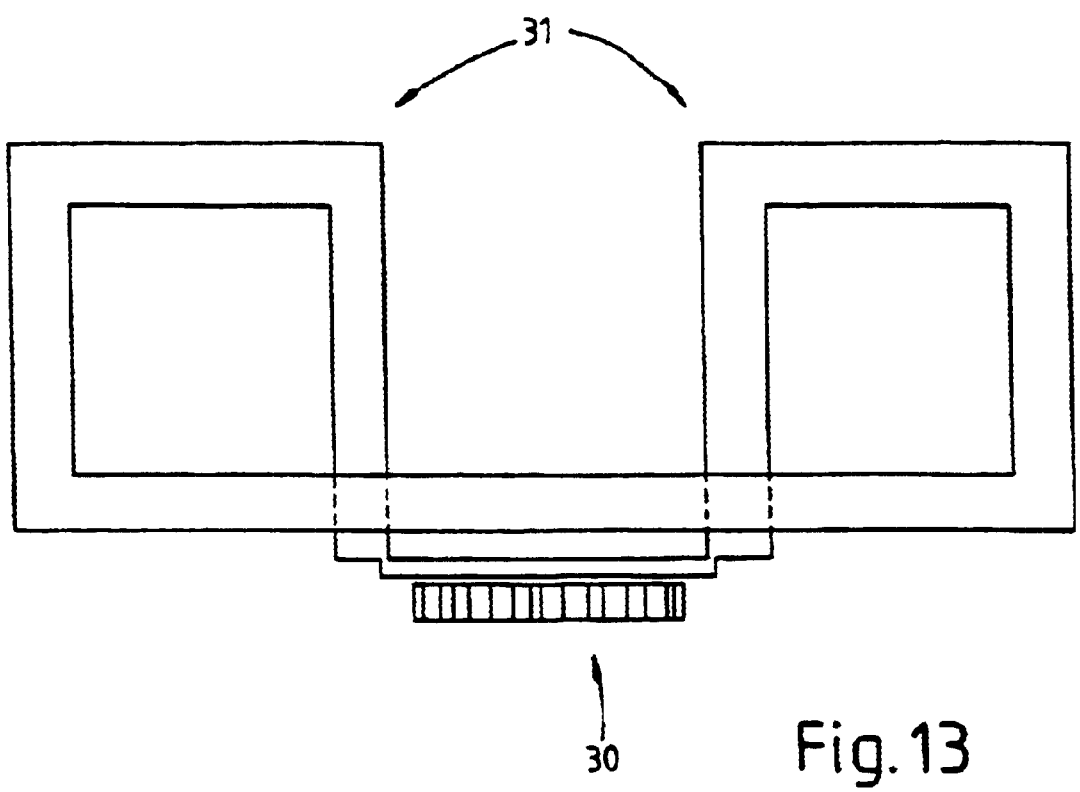

In the drawings:

FIGS. 1a and b show a multicell network of parallel-connected Josephson junctions, in a spatial arrangement, FIG. 2 shows the circuit diagram of an equivalent superconducting circuit of a quantum interference filter with N=10 junctions, FIGS. 2a to f show circuit diagrams of further superconducting circuits according to the invention, FIG. 3 shows a voltage response function for a network with N=30 junctions, FIGS. 4a and b show periodic voltage response functions for conventional SQUIDs, FIG. 4c shows the voltage response function of a superconducting quantum interference filter according to the invention, FIG. 4d shows the voltage response function of a SQUID and a SQIF, FIG. 5 shows a symbolically illustrated spatial arrangement of a superconducting quantum interference filter with an indication of the vector basis of the three-dimensional space, FIG. 6 shows a diagrammatically illustrated, flat superconducting quantum interference filter with a magnetic field compensation device, FIG. 7 shows a superconducting quantum interference filter with a parallel-connected control line, in a diagrammatic view, FIG. 8 shows a diagrammatically illustrated networking of SQIF sections, FIGS. 9a to c show diagrammatically illustrated, flat, superconducting quantum interference filters with a geometrical arrangement for minimizing the influence of self-fields, FIG. 10a shows a network made from network cells connected in series, FIG. 10b shows a voltage response function corresponding to a network in accordance with FIG. 10a, in the case of a series circuit for N=100 network cells, FIG. 10c shows a current-voltage characteristic of a network in accordance with FIG. 10a, when it is operated as a current amplifier with the aid of a compensation circuit, FIG. 11a shows, in the top picture, the typical voltage response function of a conventional SQUID with the associated frequency spectrum in the lower picture, FIG. 11b shows, in the top picture, a typical voltage response function of a network made from identical cells, and the associated frequency spectrum in the lower picture, FIG. 11c shows, in the upper picture, the voltage response function of an interference filter according to the invention without periodicity, and the associated spectrum in the lower picture, FIG. 11d shows, in the top picture, a voltage response function and, in the bottom picture, the associated spectrum of a quantum interference filter which has a technically conditioned, comparatively large periodicity, and FIG. 12 shows a calibration curve of a typical two-junction DC/SQUID, and FIG. 13 shows a diagrammatically illustrated, flat superconducting quantum interference filter with a superconducting pickup loop which amplifies the primary magnetic field at the location of the filter.

DESCRIPTION OF THE EXEMPLARY EMBODIMENTS

Figure 1B:
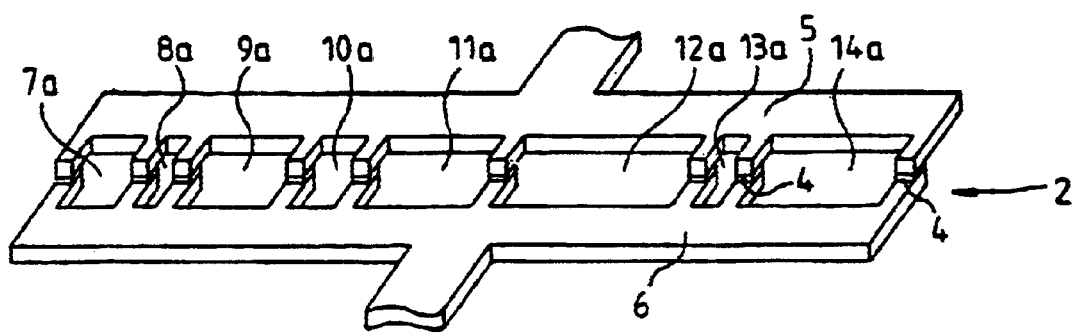

The exemplary embodiments of the invention sketched in FIG. 1 are explained below in more detail. The illustrations in accordance with FIGS. 1a and 1b show the physical realizations according to the invention of simple multiloop networks 1, 2 with Josephson junctions 3, 4 whose geometry and detection response constitute superconducting quantum interference filters. The networks 1, 2 comprise superconducting regions 5, 6 which are interconnected by the Josephson junctions 3, 4. The superconducting regions can in this case consist both of low-temperature superconducting materials and of high-temperature superconducting materials. Again, the operability, according to the invention, of the network does not depend on the specific design of the Josephson junctions (for example break junctions, step junctions, microbridges, etc.). The quantitative data for the exemplary embodiments relate, for example, to the parameter specifications of the typical Josephson junctions corresponding to the prior art and made from conventional superconductors, for example Josephson junctions produced using $Nb/AlO_x/Nb$ technology such as are used in a conventional SQUID magnetometer. Such junctions have typical critical currents $i_c$ of approximately 200 µA and a normal resistance $r_n$ which is defined by an ohmic resistor, connected externally in parallel, of, for example, approximately 1 Ω, and a geometrical shunt capacitor $c_n$ in the picofarad range. The spatial extent of the network can be comparable to the conventional SQUIDs. The dimensions of the cells of the network are then in the range of µm to mm. However, depending on application, networks according to the invention can also have cells with larger or smaller dimensions.

In FIGS. 1a and 1b, the superconducting quantum interference filter is made up of a flat network 1, 2 made from Josephson junctions 3, 4, which has cells 7 to 13 or 7a to 14a, which in each case have two junctions in the current direction. The circuit diagram of the equivalent superconducting circuit of a SQIF with N=10 junctions is illustrated in FIG. 2. The network is characterized in that the individual areas of cells 1 to 9 are of different size, and the surface areas $|a_j|$ of the various network cells are not in a rational ratio to one another. 14 denotes equivalent resistors. The cross marks the Josephson junctions 1 to 10. The dashed and dotted box around the Josephson junctions indicates the region connected in a superconducting fashion. The bold lines inside this box symbolize superconducting connections. Under these preconditions, in particular, the physical effect of multiple macroscopic quantum interference arises in such a way that the quantum mechanical wave functions which describe the state of the individual superconducting regions of the network interfere constructively only when the magnetic flux penetrating the network vanishes identically. The macroscopic overall state of the network can be read out by virtue of the fact that the network is driven by a constant supercritical current $I_0$. The result is a voltage response function $<V(\vec{B};I_0)>$, which has only a global absolute minimum at $|\vec{B}|=0$ and rises monotonically with increasing $|\vec{B}|$ until, finally, a value $V_{max}(\vec{B};I_0)$ which remains approximately constant is reached, said value no longer changing substantially as vertical $|\vec{B}|$ continues to increase, as is illustrated diagrammatically in FIG. 3 for a network according to the invention with N=30 junctions. The voltage response function of the superconducting quantum interference filter is thereby unique for a magnetic field $\vec{B}$ with $0<|\vec{B}|<|\vec{B}|_s$ present at the location of the network. The result for $|\vec{B}|>|\vec{B}|_s$ is a voltage response fluctuating close to $V_{max}$ whose variance quickly becomes smaller with increasing N, $V_{max}$ being the global absolute maximum of the voltage response function (compare FIG. 3). The measuring range of the superconducting quantum interference filter is determined by the spacing between the global minimum $V_{min}=<V<|\vec{B}|=0;I_0)>$ and $V_{max}-\Delta V$, $\Delta V$ designating the spacing between the smallest local minimum for $|\vec{B}|>|\vec{B}|_s$ and $V_{max}$. The value $|\vec{B}|=0$ therefore defines the lower bound of the measuring range, and the value of $|\vec{B}|_s$, at which the voltage response reaches the value $V_{max}-\Delta V$, defines the upper bound $|\vec{B}|_s$ of the measuring range (compare FIG. 3). The value of $\Delta V$ depends in this case on the number of the cells which the network has, and on the selection of the surface areas of the individual network cells or on their ratios to one another. This is explained in more detail in the theoretical description, following in the next paragraph, of the superconducting quantum interference filter.

Sketched in FIGS. 2b to f are embodiments of networks in which the individual network cells comprise a further junction or a plurality of further junctions in addition to the two functionally required junctions 3 in accordance with FIG. 2a. The junctions are denoted in this case as crosses. The bold lines mark superconducting connections. The thin lines can be normally conducting or superconducting. The additional junctions can be provided in this case in the individual network cells in such a way that none or only a small part of the driving current flows through them (not directly energized junctions 3a) and, on average, there is also no time-variant voltage drop. The screening currents induced by a magnetic field in the individual cells can be reduced by such embodiments. Furthermore, the influence of self-inductances and mutual inductances can be reduced thereby. The additional junctions can, however, also be provided such that they are flowed through by the driving current I (directly energized junctions 3b). Also possible is a combination of one junction 3a or a plurality of junctions 3a and one junction 3b or a plurality of junctions 3b in individual cells or a plurality of cells of the network.

Illustrated in FIGS. 4a to 4c for the purpose of direct comparison is the voltage response function of a conventional single-loop SQUID (FIG. 4a), a conventional multi-loop SQUID with regular standard cells of identical size (FIG. 4b) and of a superconducting quantum interference filter (FIG. 4c). Said example of a single-loop SQUID comprises a single superconducting loop or cells with two Josephson junctions, the multiloop SQUID made from a parallel arrangement of such identical single-loop SQUIDs ("ladder array") with N=30 junctions, and the superconducting quantum interference filter is designed according to the invention and likewise has N=30 junctions. The driving current $I_0$ is selected for all three arrangements such that for $|\vec{B}|=0$ the current per junction has the value $1.1\,i_c$, and so the voltage range $V_{max}-V_{min}$ is the same for all three devices. The voltage response functions of a conventional SQUID and a SQIF are illustrated once again with the aid of a concrete exemplary embodiment in FIG. 4d. Whereas devices according to the prior art (single-loop SQUID and multiloop SQUID) have a periodic voltage response function <V> of period $\Phi_0$ in such a way that no absolute measurement of the magnetic field is possible, the flat superconducting quantum interference filter has a uniaue voltage response function. This voltage response function of the SQIF thereby permits absolute quantitative measurement of the magnetic field. In the example selected, the measuring range is between $\Phi=0$ and $\Phi=B_\perp \overline{F} \approx 0.02\Phi_0$. Given a mean network cell area $\overline{F}$ in the range of $\mu m^2$, this corresponds to magnetic field strengths of between $B_\perp=0$ and $B_\perp=10^{-4}$ T and for $\overline{F}$ in the range of $mm^2$ magnetic field strengths of between $B_\perp=0$ T and $B_\perp=10^{-10}$ T. In these examples, the limit resolutions can be in the range from $10^{-13}$ T to $10^{-16}$ T.

The measuring range of the device according to the invention can be varied as desired in conjunction with a constant sensitivity by using a compensation circuit with the aid of which a magnetic flux of known strength is coupled into the superconducting quantum interference filter in a controlled fashion. Corresponding devices are presented in the further exemplary embodiments.

The electrotechnical theoretical description of the superconducting quantum interference filter can be performed with the aid of what is known as the RCSJ model (RCSJ= Resistively and Capacitively Shunted Junction) for the individual Josephson junctions taking account of the network theory for superconducting circuits. In the RCSJ model, the individual Josephson junction is described by a nonlinear inductance which is connected in parallel with an ohmic shunt resistor $r_n$ and a geometrical shunt capacitor $c_n$ characterizing the tunnel barrier. The description of the macroscopic state of the Josephson junctions is performed by the gauge-invariant difference between the macroscopic quantum mechanical phases at the two opposite superconducting electrodes of the respective junction. This phase difference is designated by $\phi_j$, $j=1 \ldots N$ indicating the individual junctions of the network. The relations on which the network dynamic is based are then given by $$I_j = i_c \sin(\phi_j) + \frac{v_j(t)}{r_n} + c_n \partial_t v_j(t), \quad (1)$$

$$v_j(t) = \frac{\hbar}{2e} \partial_t \phi_j, \quad (2)$$

$$\phi_{j+1} - \phi_j = 2\pi \frac{\Phi_j}{\Phi_0} \quad (3),$$

$I_j$ denoting the current, flowing through the junction with index j, with $$\sum_{j=1}^{N} I_j = I_0$$

and $\Phi_j$ denoting the magnetic flux penetrating the network cell with index j. Equation 1 describes the nonlinear relation between the current $I_j$ and the voltage $v_j(t)$ dropping across the junction in the RCSJ model. Equation 2 corresponds to the second Josephson relation, in accordance with which the voltage $v_j(t)$ dropping across the junction is directly proportional to the time derivative $\partial_t \phi_j$ of the phase difference $\phi_j$. Equation 3 is an expression of the quantization of the magnetic flux through a closed superconducting loop.

For the sake of simplicity, it is assumed in the theoretical description that the network junctions are identical, that is to say that both the critical currents $i_c$ and the parallel-connected shunt resistors $r_n$ and shunt capacitors $c_n$ are not subject to statistical or systematic scattering. The occurrence of typical manufacturing-induced instances of parameter scattering does not, however, impair the serviceability of the superconducting quantum interference filter. The theoretical description within the framework of the RCSJ model is, moreover, limited to what are called point contacts, that is to say to junctions which are so small that the phase differences do not vary over the extent of the junction barrier. This is also the customary assumption in the theoretical description of conventional SQUIDs. This assumption is particularly justified in superconducting quantum interference filters, since, by contrast with conventional SQUIDs, with increasing number of the network cells, the interference patterns occurring are dominated by the network dynamics and therefore depend only extremely weakly on the specific geometry of the individual junctions.

The network equations following from the current conservation and Equations 1 to 3 link the magnetic field $\vec{B}$ acting at the location of the network, and the driving current $I_0$, with the voltage V(t) dropping across the circuit. For magnetic fields $\vec{B}$ which are static or vary slowly by comparison with the network frequency, the network equation for SQIF of this exemplary embodiment, and in general for SQIFs which comprise parallel-connected network cells, can be written as a nonlinear differential equation of the form $$\frac{\hbar}{2e} \frac{c_n}{i_c} \partial_t^2 \phi_1 + \frac{\hbar}{2e i_c r_n} \partial_t \phi_1 + |S_N(\vec{B})| \sin(\phi_1 + \delta_N) = \frac{I_0}{N i_c} \quad (4)$$

$$v_1(t) = \frac{\hbar}{2e} \partial_t \phi_1 \quad (5),$$

the magnetic field $\vec{B} = \vec{B}_{ext} + \vec{B}_c$ being composed of the primary external field $\vec{B}_{ext}$ to be measured and, possibly, a secondary magnetic compensation field $\vec{B}_c$ produced in a controlled fashion. The complex ($i=\sqrt{-1}$) structure factor $S_N(\vec{B})=|S_N(\vec{B})|\exp[i \, \delta_N(\vec{B})]$ occurring in Equation 4 describes the geometrical and dynamic properties of the superconducting quantum interference filter composed of N−1 cells. It determines the spatial and temporal interference properties of the network as a function of the strength of the magnetic field to be measured. The phase shift $\delta_N$ likewise depends on the specific geometry of the arrangement, but has no influence on the time-averaged voltage response function <V($\vec{B}$;$I_0$)>.

The complex structure factor $S_N(\vec{B})$ is defined as $$S_N(B) = \frac{1}{N} \sum_{n=0}^{N-1} \exp\left(\frac{2\pi i}{\Phi_0} \sum_{m=0}^{n} \langle \vec{B}, \vec{a}_m \rangle \right) \quad (6),$$

the vectors $\vec{a}_m$ denoting the oriented surface elements $$\frac{\vec{a}_m}{|\vec{a}_m|} = \text{surface normal},$$

$|\vec{a}_m|$=surface area of the (mth loop) of the individual network loops, and $\vec{a}_0=0$. It therefore holds for the magnetic flux penetrating the individual network loops that $\Phi_m = \langle \vec{B}, \vec{a}_m \rangle$, the scalar product being defined for any two vectors $\vec{a}, \vec{b}$ by $\langle \vec{a}, \vec{b} \rangle = |\vec{a}||\vec{b}|\cos\angle(\vec{a}, \vec{b})$. If the magnetic field $\vec{B}$ varies over the extent of the loop, the corresponding integral representation then occurs at the point of this scalar product. The periodicity of the network is determined by the accumulated magnetic fluxes $$\alpha_n = \sum_{m=0}^{n} \langle \vec{B}, \vec{a}_m \rangle \quad (7)$$

with n=0 ... N−1.

For conventional single-loop SQUIDs, in which only one oriented area $\vec{a}_1$ exists, with N=2 $S_N$ assumes the value $$S_2 = \frac{1}{2}\left(1 + \exp\left[\frac{2\pi i}{\Phi_0}\Phi\right]\right)$$

and $$|S_2| = \cos\left(\frac{\pi\Phi}{\Phi_0}\right).$$

For flat periodic multiloop SQUIDs with identical loop surfaces $\vec{a}_1 = \vec{a}_2 = \vec{a}_3 = \ldots = \vec{a}_{N-1}$, $\vec{a}_n = n\Phi$ with $\Phi = B_\perp|\vec{a}_1|$ and so $$S_N = \frac{1}{N}\sum_{n=0}^{N-1} \exp\left[\frac{2\pi i}{\Phi_0}n\Phi\right]$$

is a geometric series, the result being $$|S_N| = \frac{\sin(N\pi\Phi/\Phi_0)}{N\sin(\pi\Phi/\Phi_0)}.$$

The structure factors for such conventional SQUIDs corresponding to the current state of the art therefore have periodic structure factors independently of the number of junctions. These periodic structure factors are the cause of the likewise strongly $\Phi_0$-periodic voltage response functions $\langle V(\vec{B};I_0)\rangle$ of such devices, and thus the cause of the fact that no absolute measurement of the magnetic field is possible with the aid of such devices corresponding to the prior art. Superconducting quantum interference filters according to the invention have, by contrast, no periodic structure factors, since $S_N(\vec{B})$ according to Equation 6 cannot be periodic for incommensurable accumulated magnetic fluxes $\alpha_n$. Superconducting quantum interference filters therefore also have no periodic voltage response functions $\langle V(\vec{B};I_0)\rangle$ and therefore permit the absolute measurement of magnetic fields.

According to Equation 3, it holds for external fields which are static or vary slowly by comparison with the network frequency that $v_j(t)=v_1(t)$ for all j=1 ... N, that is to say $v_1(t)$ defines the AC voltage dropping across the superconducting quantum interference filter. The network frequency ν is related via the Einstein relation $h\nu=2e\langle V(\vec{B};I_0)\rangle$ to the time average of this AC voltage, the voltage response function $$\langle V(\vec{B};I_0)\rangle = \frac{1}{T}\int_0^T v_1(t)dt,$$

where $$T = \frac{1}{\nu}.$$

For typical Nb|AlO$_x$|Nb Josephson junctions, the network frequency ν is approximately 100 GHz, and so the frequency $\nu_{ext}$ for the external field can be in a range from $\nu_{ext}=0$ to approximately 20 GHz. As in the case of conventional SQUIDs, the DC voltage $\langle V(\vec{B};I_0)\rangle$ dropping across the network on average over time can serve as easily accessible measured variable. The influence of inductances and self-fields caused by the bias current is neglected in Equations 4 and 5 in order to improve comprehension. In fact, given a suitable design of the superconducting quantum interference filter, inductances and self-fields can be minimized such that the serviceability of the device is not impaired by these influences. Appropriate devices are presented in the further exemplary embodiments.

Neglecting the shunt capacitors $c_n$, something which is justified to a very good approximation for typical Josephson junctions, permits an analytical solution for the voltage response function:

$$\langle V(B;I_0)\rangle = i_c r_n \sqrt{\left(\frac{I_0}{Ni_c}\right)^2 - |S_N(B)|^2} \quad (8)$$

As is sketched in FIG. 4a, this voltage response function is periodic with period $\Phi_0$ for all SQUIDs corresponding to the present state of the art. By contrast, for SQIFs according to the invention the voltage response function is not periodic. This is illustrated in FIG. 4c. The voltage response function of the superconducting quantum interference filter has a minimum for $\Phi=0$, like the voltage response function of conventional SQUIDs. By contrast with conventional SQUIDs, this minimum is not, however, repeated in the case of an increasing external field. The voltage response is therefore uniquely distinguished for $\Phi=0$ and, depending on design, permits absolute quantitative measurement of the external magnetic field directly or with the aid of a suitable compensation circuit for the magnetic field. Since the absolute value of the structure factor SN features quadratically in Equation 8, the voltage response function for devices according to the invention fluctuates in the top part of the graph only very slightly about the value $V_{max}$ and the result is a decidedly steep edge between $V_{min}$ and $V_{max}$ (compare FIG. 4c).

The structure factor $S_N(\vec{B})$ of the superconducting quantum interference filter can be optimized in such a way that the voltage response function $\langle V(\vec{B};I_0)\rangle$ has a maximum measuring range of $0<|\vec{B}|<|\vec{B}|_s$. This is the case whenever the spacing $\Delta V$ between the smallest local minimum of V and the maximum voltage value $V_{max}$ is minimized for a given total area $$\sum_{m=1}^{N-1} |\vec{a}_m|$$

(compare also FIG. 3) and given number of network junctions N in the operational range. The maximum operational range of a superconducting network is determined in this case by the maximum achievable compensation field strength.

For flat networks, the case can arise in which a minimum possible length variation $l_0$ of the conductor tracks occurs which is caused by the production process. The surface areas $|\vec{a}_m|$ of the network loops can then be defined by $|\vec{a}_m| = q_m l_0^2$, the numbers $q_m$ being positive integer numbers. In the most unfavorable case, two surface elements can therefore differ only by the absolute value of $l_0^2$ for production reasons. This has the result that the structure factor $S_N(\vec{B})$, and thus the voltage response function $<V(\vec{B};I_0)>$ of the superconducting quantum interference filter, could vary periodically from a purely theoretical viewpoint. However, the period which possibly arises is very large with reference to $\Phi_0$ and corresponds to $$\frac{\Phi_0}{GCD} A_{tot},$$

where GCD is the greatest common divisor of the absolute values $|\vec{a}_m|$ of the oriented surface elements of a planar network, and $A_{tot}$ denotes the total area of the SQIF, $$A_{tot} = \sum_{m=1}^{N-1} |\vec{a}_m|.$$

A typical value, corresponding to the prior art, for $l_0$ is approximately one hundred nm (niobium process). The minimum area difference $l_0^2$ is therefore of the order of magnitude of $10^{-2}$ µm² in the case of an assumed network cell area of the superconducting quantum interference filter of $10^{-2}$ mm². If the numbers $q_m$ are now themselves coprime, for example because they are selected in relation to (different) prime numbers, the pr iod of the voltage response function is given as $$\frac{\Phi_0}{l_0^2} A_{tot}.$$

For typical total areas $A_{tot}$ of several 1000 µm², this period is far outside the practically relevant measuring or operational range. Consequently, for an operational range given in a specific application, there is always a superconducting quantum interference filter with an optimum area, number of junctions and associated structure factor.

A further exemplary embodiment of the invention is illustrated in FIG. 5. The network cells fall here into three groups in such a way that a complete vector basis of three-dimensional space can be formed from the oriented surface elements $\vec{a}_m$. This design of the invention, which is denoted below as vector SQIF, has the advantage that both the strength and the direction of the primary magnetic field to be measured can be determined uniquely and with very high accuracy by means of appropriately designed compensation fields which, for example, each generate a controllable secondary field parallel to each of the base vectors formed from the $\vec{a}_m$. This permits the unique quantitative reconstruction of the primary magnetic field vector $\vec{B}_{ext}$ in terms of absolute value, direction and phase, and allows a multiplicity of novel applications. For example, it is even possible with two such arrangements according to the invention exactly to localize the sources of a magnetic field and to determine their strength. This can include the wireless readout of detector fields when the individual detector signals comprise temporary electric currents. Again, reading out or processing electronic or magnetic data memories is possible with such arrangements in the GHz to THz range in conjunction with a very high temporal resolution and thus an extremely fast processing rate, this being done in a contact-less fashion and virtually without consuming or dissipating power. Further examples of the application of such vector SQIFs are the spatial and temporal high-resolution measurement of metabolic processes, for example in the human brain, of signals in nuclear magnetic resonance or the magnetic field distribution in the upper earth crust such as, for example, in geological exploration. The crosses in FIG. 5 symbolize the Josephson junctions, and busbar resistors are denoted by the reference numeral 15. The thick bold lines illustrate superconducting connections. The two thick bold lines 16, 17 additionally delimit the part of the network connected in a superconducting fashion.

In an exemplary embodiment which is not illustrated, the vector SQIF is constructed from three individual flat SQIFs which operate independently of one another and whose surface normals form a vector basis of three-dimensional space. This device has the advantage that the individual flat SQIFs can be produced without any problem with the aid of the standard methods, corresponding to the current state of the art, of thin-film technology.

Quantitative measurement can be performed here either by simultaneous compensation of the three components of the external magnetic field, as in the exemplary embodiment of the last section, or by direct measurement of the voltage dropping across each individual SQIF. For specific applications, the latter measuring method is a further advantage of such arrangements, since there is then no need for compensation devices.

In two further exemplary embodiments which are not illustrated, the vector SQIF corresponding to the last or penultimate section is designed such that the surface normals of the individual SQIFs, or the oriented surface elements $\vec{a}_m$, are arranged in such a way that they can be used to form a complete vector basis of a two-dimensional subspace of the three-dimensional space. This design can be advantageous when the magnetic field is to be measured only in one plane, for example when flat detector fields or memories are involved.

FIG. 6 illustrates an exemplary embodiment of a flat SQIF in which the magnetic compensation field is produced by two control lines 18, 19 which are parallel to the network and therefore perpendicular to the direction of the driving current. If, in such an arrangement according to the invention, a current $I_{k1}$, $I_{k2}$ flows through one or both control lines 18, 19, a magnetic flux of known strength and capable of being controlled very precisely by this current is coupled into the cells of the SQIF. This flux can compensate the flux caused by an external magnetic field in such a way as to minimize the voltage dropping across the SQIF. This "operating point" is then always situated at the absolute minimum of the calibration curve $<V(\vec{B};I_0)>$ of the SQIF. Since the spacing between the control line and network is known, the value of the compensation current can be used to determine directly the strength of the external magnetic field. The selection of another operating point within the measuring range of the SQIF is also possible. This design has the advantage that the operating range of the SQIF, that is to say the range of the magnetic field strengths which can be measured with the aid of the device, is bounded above in principle only by field strengths which destroy the phase coherence between the regions capable of superconducting which are separated by tunnel barriers. A further advantage is that in this design SQIFs can still be operated in a fully serviceable fashion even when the actual measuring range, that is to say the range in which the voltage response function is injective, is very small. This can occur whenever, owing to manufacturing tolerances, there occur, in the voltage response function, secondary maxima whose voltage values do not differ very strongly from the voltage value of the absolute minimum. However, as long as the measuring range is larger than the resolution limit of the SQIF, which is typically a few nV, according to the invention the device remains fully serviceable in a design with a compensation circuit. Also advantageous in the case of a design with control lines is that the compensation circuit is provided on chip and requires no additional production steps. According to the current prior art, in the case of thin-film structures the control lines can be provided in the layers situated above or below the network feeder lines. It can also be advantageous to provide a plurality of control lines, for example when for the purpose of precision measurements a temporally varying compensation field is to be superimposed on a static compensation field.

SQIFs according to the invention should reach their maximum sensitivity for operation modes in which temporally varying compensation fields are used. Moreover, in such modes it is possible not only simultaneously to determine the strength and direction of the field to be measured, but also its phase angle. It is thereby possible to reconstruct the measured time-variant signal completely and therefore to make an identical copy of this signal. The advantage of the devices consists in that such copies can be amplified and passed on without any loss of information.

The crosses in FIG. 6 once again symbolize the Josephson junctions. Symbolically illustrated busbar resistors are denoted by the reference numeral 20. The dashed and dotted line describes the boundary of the necessarily superconducting part of the network.

In a design for precision measurements which is not illustrated, the compensation circuit is provided outside the SQIF and comprises a pair of coils which is orientated in such a way that the SQIF lies in a plane perpendicular to the axis of the pair of coils between the two coils. Such compensation circuits can have the advantage that the magnetic compensation field at the location of the SQIF has a very high level of homogeneity, and thereby permits extremely precise measurements. Designs in which compensation is local, that is to say performed by control lines and by compensation circuits provided outside the SQIF, can also be advantageous in minimizing the influence of interference, such as noise and fluctuations. SQIFs according to the invention which have compensation circuits, for example in the form of control lines, can also be used as logic components (actuators) for superfast high-performance computers. SQIFs with two local control lines can provide OR logic modules which switch only when an exactly equal parallel current is flowing through both control lines. In this case, the switching times of such actuators are in the region of the network frequency, that is to say in the GHz to THz range. An advantage of such logic modules resides in this case also in the fact they simultaneously act as amplifiers, since even very small control currents lead to the maximum voltage response, which is several hundred $\mu$V to mV for present-day typical Josephson junctions.

The sensitivity or the gain of the arrangements according to the invention can be multiplied by a series connection of SQIFs, as is illustrated in FIG. 7, which are coupled to one another by an active control line 21 which, for its part, also contains Josephson junctions. The crosses symbolize Josephson junctions. Symbolically illustrated busbar resistors are denoted by the reference symbol 22. The bold lines inside the network represent superconducting connections and symbolize the superconducting region 23, which also contains the Josephson junctions.

The active control line 21 in this case synchronizes the one-dimensional SQIF array even in the case of strongly deviating structure factors of the various SQIF sections and parameter inhomogeneities. If the manufacturing tolerances are low, it is also possible in some circumstances to dispense with the active control line. The advantage of such SQIF arrays, which can also be designed in two dimensions, resides in the fact that the limit of resolution of the device decreases with the number of SQIF sections 23, and the gain grows with the number of SQIF sections. Given optimum selection of the mode of operation, it should be possible in the range of magnetic field measurement to use such arrangements to achieve, for example, limits of resolution which are many orders of magnitude lower than those in the case of conventional SQUID systems. Again, SQIF arrays can be produced without any problem using the production methods corresponding to the prior art.

An exemplary embodiment in which a plurality of SQIF sections 24 are connected in a hierarchically organized SQIF array is shown in FIG. 8. Here, the basic elements of such a hierarchical SQIF array are identical basic SQIFs 24 with an identical structure factor. These basic SQIFs are arranged on a second hierarchical plane in the form, once again, of a SQIF 25, which serves anew as a basic SQIF 25 for a third hierarchical plane. Arrangements with more than three hierarchical planes (k=1, 2, 3, . . . ) are also possible. The advantage of such arrangements resides in the fact that, depending on the relationships between the oriented surface elements of the basic SQIF and the SQIF or SQIFs of higher hierarchical planes, and as determined by the generally different structure factors on the various planes, the interference patterns which are produced on the various planes once again interfere to form an overall pattern, and this renders possible an extremely high resolution. Since the oriented surface elements $\vec{a}_m$ in the various hierarchical planes can be differently aligned, the resulting interference pattern is, moreover, extremely sensitive with reference to the direction of the external field. According to the current state of production engineering, such SQIF systems of multidimensional design cannot be implemented on chip. However, it is possible to produce the individual planar components of a multidimensional SQIF system with the aid of conventional methods of thin-film technology, and then to connect said components with the aid of superconducting twisted-pair cables such that an overall system of the type described is produced. Such superconducting twisted-pair cables have the advantage in this case that no effective flux penetrates into them. The connection of different parts of the SQIF system with the aid of such superconducting twisted-pair cables therefore has no influence on the serviceability of the overall SQIF according to the invention, since the cable featured in Equation 6 only features as an oriented surface element with a vanishingly small area.

An exemplary embodiment which shows how the inductive couplings active between different network cells can be minimized is illustrated in FIG. 9a. Such inductive couplings can reduce the sensitivity of the device when the network comprises very many cells. Since a supercritical current flows through each junction, the resulting current distribution in this case produces a self-field which, under some circumstances, however, cannot be neglected. The embodiments according to the invention as illustrated, for example, in FIG. 9b can be used to reduce the influence of the self-fields sharply. The conductor tracks of the network cells 26, 27 are designed in FIGS. 9a and 9b such that the current flowing through a network junction 28 induces only a negligible flux in the respectively next but one network cell, since the magnetic field of a short current-carrying conductor piece is substantially limited to a region perpendicular to the conductor piece. Since, for $\Phi=0$, each junction is flowed through by a current of the same strength, in this case all inductances vanish, and the global minimum of the voltage response function corresponds to that according to Equation 8. In order to minimize the self-fields of the feeder and outgoing lines, the driver current $I_0$ is fed and led off again through busbar resistors 29 which correspond to the prior art and whose distance from the network can be selected to be sufficiently large. An alternative design of a SQIF which likewise minimizes the mutual inductive influences is illustrated in FIG. 9c.

An exemplary embodiment in which the various network cells are connected in series is illustrated in FIG. 10a. The oriented surface elements $\vec{a}_m$, are also selected here such that the voltage response function of the network is not periodic, or only has a period which is very large in comparison with $\Phi_0$. In the case of a non-periodic voltage response function, the global absolute minimum of this voltage response function is at exactly $\vec{B}=0$. A typical voltage response function of a series circuit for N=100 network cells $a_1$ to $a_{100}$ and a very large period is illustrated in FIG. 10b.

Such designs have the advantage that the series circuit causes the voltage response functions of the individual network cells to add together. This produces a quantum interference filter with a very large voltage range which can enter the range of a plurality of mV or even V. By contrast with the parallel circuits, however, in this case there is no reduction in the width of the voltage response function (variance) by $\vec{B}=0$ as compared with conventional two-junction SQUIDs. However, since the spacing between adjacent network loops in series arrangements can be selected at will, without infringing the quantum interference condition, the parasitic mutual inductances can be minimized with the aid of such arrangements. Moreover, series circuits can have technically conditioned advantages in production. In particular, an increased packing density is possible, and this can be advantageous in the integration of circuits on a chip.

The theoretical description of series SQIFs can be done with the aid of Equation 8, since a series SQIF constitutes the simplest realization of a two dimensional SQIF array. For identical network junctions, the mean DC voltage dropping across an individual network cell is given for a supercritical bias current $I_0>2i_c$ by $$\langle V \rangle_n = i_c r_n \sqrt{\left(\frac{I_0}{2i_c}\right)^2 - \left|\cos\left(\pi \frac{\Phi_n}{\Phi_0}\right)\right|^2} \qquad (9)$$

in which it holds that $\Phi_n = \langle \vec{B}, \vec{a}_n \rangle$. The mean DC voltage $\langle V \rangle$ dropping across the overall series array results from $$\langle V \rangle = \sum_{n=1}^{N} \langle V \rangle_n \qquad (10)$$

It is certainly true that because of the series arrangement of the network cells $\vec{a}_n$ a structure factor cannot, as for the parallel arrangement, be defined directly by the appropriate selection of the sequence $\{\vec{a}_n\}$, but it is also possible here to set the profile of the voltage response function and, in particular, the measuring and/or operating range.

In the exemplary embodiment of FIG. 10b, for example, the oriented surface elements $\vec{a}_n$ were selected in a flat series arrangement corresponding to the arithmetic relationship $$a_n = \frac{n}{N} a_N \qquad (11)$$

in which case it holds that $a_n = |\vec{a}_n|$, and $a_N$ denotes the largest area of the series SQIF with N network cells and 2N junctions. Such a selection has the advantage, for example, that the maximum in the voltage response function follows directly on the minimum (compare FIG. 10b), and so the voltage range becomes a maximum.

In addition to the series SQIF, a typical coupling and control circuit is drawn in diagrammatically in FIG. 10a. Given an appropriate design, a magnetic compensation field which compensates an external field and/or the field which is produced by the current $I_{inp}$ is produced by the compensation current $I_{comp}$ at the location of the individual network cells. This permits the operation of the SQIF in extremely sensitive nulling mode. In this case, the current $I_{inp}$ is, for example, the input current of a pickup loop or of another signal source. Series SQIFs can also therefore be greatly advantageous, because the background noise of the circuit, for example when it is being used as a (current) amplifier, rises only in proportion to $\sqrt{N}$, whereas the voltage range grows in proportion to N. This is the case because the voltage noise of the various network cells, and/or of the Josephson junctions in these cells, is not correlated (pure current coupling), and is therefore superimposed only incoherently. Consequently, extremely low-noise amplifiers, for example, can be implemented using series SQIFs or, in general, SQIF arrays. A typical current-voltage characteristic of such an amplifier component, which can be implemented by means of a SQIF, is illustrated in FIG. 10c. Depending on the design of the SQIF, it is also possible to detect and/or amplify very small currents ($<10^{-12}$ A) in this operating mode. Further advantages of such amplifier components are their very fast switching times and that they can be used up to very high frequencies.

The periodicity characteristics of the voltage response function are an essential feature of the quantum interference filter according to the invention. The frequency spectrum of the voltage response functions of SQIFs according to the invention with reference to the magnetic flux is therefore clearly different from conventional SQUID interferometers corresponding to the prior art. This state of affairs is illustrated in FIGS. 11a to 11d with the aid of typical frequency spectra from SQUIDs corresponding to the prior art (FIGS. 11a and 11b) and of quantum interference filters according to the invention (FIGS. 11c and 11d).

FIG. 11a shows in the top picture the typical voltage response function of a conventional SQUID. The <(V(Φ)> curve is periodic with the period $\Phi_0$. The associated frequency spectrum in the bottom picture of FIG. 11a therefore shows an amplitude which is decisively dominant at $1\Phi_0$. Since the voltage response function of a SQUID is not harmonic (compare Equation 8), yet higher harmonic modes also occur at $2\Phi_0$ and $3\Phi_0$, but they have only a very small amplitude. The frequency spectrum of conventional SQUIDs is therefore dominated by the $\Phi_0$-periodic contribution. As FIG. 11b shows, this is also the case with multiloop arrangements which are constructed from identical network cells, and this is so independently of whether series arrangements or parallel arrangements of identical SQUID loops are involved. In the case of parameter imperfections or geometrical imperfections, as well, quantum interferometers corresponding to the prior art always exhibit a discrete frequency spectrum which is dominated by the $\Phi_0$-periodic contribution. In addition, in the case of imperfections all that can occur is an additional continuous spectrum which stems from the imperfections and depends on the type of the imperfections.

By contrast, quantum interference filters according to the invention have no dominant $\Phi_0$-periodic contribution in the frequency spectrum of their voltage response functions. This state of affairs is illustrated in FIGS. 11c and 11d. The frequency spectra in FIGS. 11a to 11d (bottom pictures) are butted in the respectively identical arbitrary units such that direct comparison is possible. The voltage response and the associated frequency spectrum of a quantum interference filter according to the invention, which does not exhibit periodicity, is shown in FIG. 11c. The spectrum is virtually continuous and no discrete spectrum exists. In particular, there is no significant $\Phi_0$-periodic contribution. The amplitudes of the virtually continuous spectrum are smaller by two or one order of magnitude than in the case of conventional arrangements according to FIG. 11a or FIG. 11b. Illustrated in FIG. 11d is the voltage response function and the associated spectrum of a quantum interference filter according to the invention, which exhibits a technically induced periodicity. The voltage response function has the property that its period is very much larger than $\Phi_0$, and the frequency spectrum has a discrete component with a very small amplitude at the period $\Phi_0$. This amplitude in the case of the period $\Phi_0$ is not significant and in any case does not supply a dominant contribution to the frequency spectrum. Moreover, the discrete spectrum is distinguished, in turn, in that its amplitudes are smaller by one to two orders of magnitude by comparison with the conventional arrangements.

The frequency spectra of quantum interference filters according to the invention are robust with regard to the $_0$-periodic contribution of the frequency spectrum. Parameter imperfections or geometrical imperfections do not change the above described qualitative characteristics of arrangements according to the invention.

Illustrated diagrammatically in FIG. 13 is an exemplary embodiment of a flat SQIF 30 which is provided with a superconducting pickup loop. Such pickup loops amplify the primary magnetic field by outwardly displacing the flux produced in their interior by this field. Such devices have the advantage that the primary magnetic field can be very strongly amplified at the location of SQIF by means of a suitable arrangement. A further advantage of SQIFs consists in that the total area of SQIFs can be designed so as to minimize the impedance mismatching between the pickup loop and SQIF. The sensitivity and the resolution of SQIFs can be substantially enhanced by such devices. Instead of a pickup loop, it is also possible to use superconducting surfaces (called washers) which likewise lead to the named advantages. The coupling of a gradiometer loop is also possible and leads to the named advantages in the measurement of magnetic field gradients. Suitably designed superconducting pickup loops are likewise advantageous in the detection of time-variant electromagnetic fields, since they can simultaneously serve as receiving antennas.

What is claimed:

1. A device for high-resolution measurement of magnetic fields, having a network of junctions between superconductors which exhibit Josephson effects, the network comprising a plurality of closed cells, each cell having at least two junctions connected in a superconducting fashion, wherein at least three of said cells are connected electrically and can be energized in such a way that a time-variant voltage drops across at least two junctions of each of said at least three cells, the time average of which voltage does not vanish, and wherein said at least three cells are configured differently geometrically in such a way that the magnetic fluxes enclosed by the cells in the case of an existing magnetic field differ from one another in such a way that a frequency spectrum of a voltage response function has no significant elementary-flux-quantum-periodic ($\Phi_0$-periodic) component with reference to the magnetic flux, and if a discrete frequency spectrum exists, the contribution of the $\Phi_0$-periodic component of the discrete frequency spectrum is not dominant by comparison with a non-$\Phi_0$-periodic component of the discrete frequency spectrum.

2. The device according to claim 1, wherein at least one cell of the network contains, in addition to at least two junctions across which there drops a time-variant voltage whose time average does not vanish, at least one further junction, which is not directly energized.

3. The device according to claim 1, wherein the at least three cells are configured differently geometrically in such a way that the magnetic fluxes enclosed by the cells in the case of an existing magnetic field are not in a rational ratio to one another.

4. The device according to claim 1, 2 or 3, wherein a plurality of cells form a network, in which all junctions are connected electrically in parallel such that the junctions can be energized in the same direction.

5. The device according to claim 1, 2 or 3, wherein a plurality of cells are connected electrically in series such that the junctions in the network can be energized in the same direction.

6. The device according to claim 4, wherein a plurality of said networks are connected electrically in series such that the junctions can be energized in the same direction.

7. The device according to claim 5, wherein a plurality of said networks are connected electrically in parallel such that the junctions can be energized in the same direction.

8. The device according to claim 1, wherein a plurality of said networks are connected electrically in parallel with the aid of superconducting twisted-pair cables in such a way that the junctions in the networks can be energized in the same direction.

9. The device according to claim 1, wherein the network is voltage-driven.

10. The device according to claim 1, wherein the network is current-driven.

11. The device according to claim 1, wherein the junctions are designed as point contacts.

12. The device according to claim 1, wherein the geometry of the arrangement of the cells is designed so as to reduce magnetic crosstalk between cells which is implied by a magnetic self-field produced by a current flowing in the cells.

13. The device according to claim 1, further comprising a superconducting loop arrangement fitted in such a way that the magnetic flux produced by a primary magnetic field in the superconducting loop arrangement is coupled into the cells of the network.

14. The device according to claim 1, wherein the cells of the network are aligned in a spatially differing fashion in such a way that at least two of three spatial field components of a primary magnetic field can induce a magnetic flux in the network.

15. The device according to claim 1, further comprising ohmic resistors, through which a current driving the network junctions flows.

16. The device according to claim 1, further comprising a compensation circuit for producing a secondary magnetic field in such a way that the magnetic flux produced by a primary magnetic field can be compensated in at least a portion of the network cells in a controlled fashion.

17. The device according to claim 16, wherein a computer is provided for processing a voltage response of the device and the compensation circuit.

18. The device according to claim 1, further comprising a planar arrangement in such a way that the magnetic flux produced by a primary magnetic field in the planar arrangement is coupled into at least a portion of the cells of the network.

19. The device according to claim 1, further comprising a compensation circuit for producing a secondary magnetic field in such a way that a controllable magnetic field can be produced at the location of at least a portion of the network cells.

20. The device according to claim 19, wherein a computer is provided for processing a voltage response of the device and the compensation circuit.

21. The device according to claim 1, wherein a computer is provided for processing a voltage response of the device.

* * * * *